(12) United States Patent
Noda

(10) Patent No.: US 7,429,771 B2
(45) Date of Patent: Sep. 30, 2008

(54) SEMICONDUCTOR DEVICE HAVING HALO IMPLANTING REGIONS

(75) Inventor: Taiji Noda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/114,004

(22) Filed: Apr. 26, 2005

(65) Prior Publication Data
US 2005/0247977 A1 Nov. 10, 2005

(30) Foreign Application Priority Data
May 7, 2004 (JP) .............................. 2004-138010

(51) Int. Cl.
*H01L 29/78* (2006.01)
*H01L 21/8236* (2006.01)

(52) U.S. Cl. ...................... 257/344; 257/372; 257/408; 257/E21.335

(58) Field of Classification Search ................. 257/327, 257/344, 372, 408, E21.335, E21.336; 438/276, 438/291, 585
See application file for complete search history.

(56) References Cited

U.S. PATENT DOCUMENTS

| | | | | |
|---|---|---|---|---|
| 4,835,112 A * | 5/1989 | Pfiester et al. | ............... | 438/305 |
| 5,401,994 A * | 3/1995 | Adan | ........................ | 257/335 |
| 5,532,508 A * | 7/1996 | Kaneko et al. | ............... | 257/336 |
| 5,786,620 A * | 7/1998 | Richards et al. | ............. | 257/408 |
| 5,903,029 A | 5/1999 | Hayashida et al. | | |
| 5,917,223 A * | 6/1999 | Ohuchi et al. | ................ | 257/384 |
| 5,970,353 A * | 10/1999 | Sultan | .......................... | 438/302 |
| 6,030,863 A * | 2/2000 | Chang et al. | .................. | 438/229 |
| 6,037,204 A * | 3/2000 | Chang et al. | .................. | 438/231 |
| 6,093,951 A * | 7/2000 | Burr | ............................. | 257/408 |
| 6,174,778 B1 * | 1/2001 | Chen et al. | .................... | 438/302 |
| 6,177,705 B1 * | 1/2001 | Tyagi et al. | .................. | 257/345 |
| 6,271,095 B1 * | 8/2001 | Yu | ................................. | 438/302 |
| 6,319,798 B1 * | 11/2001 | Yu | ................................. | 438/527 |
| 6,333,217 B1 * | 12/2001 | Umimoto et al. | ............. | 438/197 |
| 6,368,947 B1 * | 4/2002 | Yu | ................................. | 438/530 |
| 6,395,621 B1 * | 5/2002 | Mizushima et al. | .......... | 438/486 |

(Continued)

FOREIGN PATENT DOCUMENTS

JP  03-54823  8/1991

(Continued)

OTHER PUBLICATIONS

Japanese Office Action with English Translation issued in Japanese Patent Application No. JP 2004-366568 dated on Apr. 1, 2008.

*Primary Examiner*—Anh D. Mai
(74) *Attorney, Agent, or Firm*—McDermott Will & Emery LLP

(57) ABSTRACT

A MIS-type semiconductor device includes a p-type semiconductor substrate, a gate insulating film formed on the semiconductor substrate, a gate electrode formed on the gate insulating film, and n-type diffused source and drain layers formed in regions of the semiconductor substrate located below both sides of the gate electrode. Insides of the n-type diffused source and drain layers are formed with p-type impurity implanted regions having a lower p-type impurity concentration than the impurity concentration of the n-type diffused source and drain layer.

17 Claims, 14 Drawing Sheets

U.S. PATENT DOCUMENTS

| | | | |
|---|---|---|---|
| 6,426,278 B1 * | 7/2002 | Nowak et al. | 438/528 |
| 6,432,802 B1 * | 8/2002 | Noda et al. | 438/585 |
| 6,472,282 B1 * | 10/2002 | Yu | 438/305 |
| 6,489,236 B1 | 12/2002 | Ono et al. | |
| 6,500,739 B1 | 12/2002 | Wang et al. | |
| 6,548,361 B1 * | 4/2003 | En et al. | 438/301 |
| 6,720,632 B2 * | 4/2004 | Noda | 257/408 |
| 6,924,216 B2 * | 8/2005 | Feudel et al. | 438/525 |
| 2002/0058385 A1 * | 5/2002 | Noda | 438/305 |

FOREIGN PATENT DOCUMENTS

| | | |
|---|---|---|
| JP | 06-267974 | 9/1994 |
| JP | 07-297296 | 11/1995 |
| JP | 10-050988 | 2/1998 |
| JP | 10-056171 | 2/1998 |
| JP | 11-261069 | 9/1999 |
| JP | 2001-119021 | 4/2001 |
| JP | 2001-156293 | 6/2001 |

* cited by examiner

LATERAL DISTANCE FROM OUTER EDGE OF SIDEWALL

DEPTH FROM SURFACE

LATERAL DISTANCE FROM OUTER EDGE OF SIDEWALL

DEPTH FROM SURFACE

SEMICONDUCTOR DEVICE HAVING HALO IMPLANTING REGIONS

CROSS-REFERENCE TO RELATED APPLICATIONS

This application claims priority under 35 U.S.C. § 119 on Patent Application No. 2004-138010 filed in Japan on May 7, 2004, the entire contents of which are hereby incorporated by reference.

BACKGROUND OF THE INVENTION (a) Fields of the Invention

The present invention relates to semiconductor devices which have MIS transistors capable of accomplishing a further miniaturization and operable at high speed and with low power consumption, and to methods for fabricating such a device.

(b) Description of Related Art

Accompanied with high integration of semiconductor integrated circuits, miniaturization of MIS transistors in the circuits is demanded. To accomplish this miniaturization, MIS transistors are required which have a heavily-doped source and drain structure with shallow junctions of source and drain regions (see, for example, Japanese Unexamined Patent Publication No. H11-261069).

Hereinafter, an example of conventional methods for fabricating a semiconductor device with a MIS transistor will be described with reference to the accompanying drawings:

FIGS. 12A to 12E show sectional structures of a conventional semiconductor device in the order of its fabrication process steps.

First, in the step shown in FIG. 12A, boron (B) ions serving as a p-type impurity are implanted into a semiconductor substrate 101 made of p-type silicon on an implantation condition of an implantation energy of 10 keV and a dose of $2 \times 10^{12}$ ions/cm$^2$. Thereafter, thermal treatment is performed to form a p-type diffused channel layer 102 in a channel formation region of the semiconductor substrate 101.

Next, in the step shown in FIG. 12B, a gate oxide film 103 is formed on the semiconductor substrate 101 and subsequently a gate electrode 104 of polysilicon is formed on the gate oxide film 103.

Then, in the step shown in FIG. 12C, using the gate electrode 104 as a mask, arsenic (As) ions serving as an n-type impurity are implanted into the semiconductor substrate 101 to form n-type implanted extension layers 105A. Subsequently, using the gate electrode 104 as a mask, boron (B) ions serving as a p-type impurity are implanted into the semiconductor substrate 101 to form p-type implanted pocket layers 106A.

In the step shown in FIG. 12D, an insulating film is deposited over the semiconductor substrate 101, and then the deposited insulating film is subjected to an anisotropic etching to form sidewalls 107 on side surfaces of the gate electrode 104.

Next, in the step shown in FIG. 12E, using the gate electrode 104 and the sidewalls 107 as a mask, arsenic ions serving as an n-type impurity are implanted into the semiconductor substrate 101. Thereafter, the semiconductor substrate 101 is subjected to thermal treatment to form n-type diffused source and drain layers 108 in regions of the semiconductor substrate 101 located below respective sides of the sidewalls 107. In this treatment, n-type diffused extension layers 105 made by diffusion of the n-type implanted extension layers 105A are formed in regions of the semiconductor substrate 101 located below the sidewalls 107 and between the n-type diffused source and drain layers 108 and the p-type diffused channel layer 102, respectively, and p-type diffused pocket layers 106 made by diffusion of the p-type implanted pocket layer 106A are formed in regions of the semiconductor substrate 101 located below the n-type diffused extension layers 105, respectively.

In order to miniaturize the MIS transistor without manifesting a short channel effect, the conventional fabrication methods as described above tend to lower the implantation energy of the impurity ion for forming the n-type diffused extension layers 105 and increase the temperature of the thermal treatment for activation.

SUMMARY OF THE INVENTION

The above-described conventional method for fabricating a semiconductor device with a MIS transistor, however, has the following problems.

First, in the step shown in FIG. 12E, using the gate electrode 104 and the sidewalls 107 as a mask, a high dose of arsenic ions for forming the source and drain regions are implanted into the semiconductor substrate 101, and then thermal treatment for activation is performed at a high temperature. In this case, transient enhanced diffusion (TED) is induced in the impurity atoms (arsenic) forming the n-type diffused source and drain layer 108, so that the resulting impurity atoms diffuse in a deep region within the semiconductor substrate 101. This causes a problem that a desired impurity profile cannot be provided. Note that the transient enhanced diffusion refers to abnormal diffusion in which diffusion of impurity atoms is enhanced by interaction of impurity atoms with excess point defects caused by damages mainly resulting from fabrication processes such as ion implantation.

Second, if annealing at a temperature higher than required is performed in order to suppress TED of the impurity atoms implanted into the n-type diffused source and drain layer 108, impurity redistribution occurs in the n-type diffused extension layer 105 having once been formed shallowly. This simultaneously causes a problem that the junction thereof is made deep. The depth and shape of the junction of the n-type diffused extension layer 105 directly affect short channel characteristics and driving current of the semiconductor device. Therefore, in the thermal treatment process for activating the impurity of the n-type diffused source and drain layer 108, prevention of redistribution of the impurity profile in the diffused extension layer 105 is as important as control of the impurity profile of the source and drain region 108.

FIG. 13 shows the lateral (the parallel direction with the substrate surface) impurity concentration profile of a portion of the n-type diffused source/drain layer 108 which is taken along the line XIII—XIII in FIG. 12E. FIG. 13 plots the logarithm of the impurity concentration in ordinate and the distance from the outer edge of the sidewall in abscissa. In FIG. 13, the alternate long and short dashed curve represents the concentration of boron (B) implanted to form the p-type diffused channel layer 102 and the p-type diffused pocket layer 106, while the broken curve represents the concentration of arsenic (As) implanted to form the n-type diffused source and drain layer 108. As understood from FIG. 13, in the conventional structure, inside of the n-type diffused source and drain layer 108 has the following profile: in the vicinity of the junction with the p-type diffused pocket layer 106, a segregation region in which boron is segregated and a region in which the boron concentration is decreased are formed by the field effect resulting from the pn junction, while away from the vicinity of the junction, the boron concentration is equal to the channel concentration employed for implantation into the substrate (which includes pocket implantation). Therefore, arsenic implanted to form the n-type diffused source and drain layer 108 has a sufficiently higher concentration than boron implanted into the substrate, so that the implanted arsenic is hardly affected by the boron. This results in the occurrence of TED. In addition, excess point defects caused by the arsenic implantation for forming the n-type diffused source and drain layer 108 spread even into the diffused channel layer 102 below the gate electrode 104 during the diffusion, and the excess point defects entering below the gate electrode 104 would induce reverse short channel effect that increases the threshold voltage.

Third, as miniaturization of transistors proceeds to make the gate lengths thereof smaller, the implantation energy of arsenic ions for forming the n-type diffused source and drain layer 108 is reduced. When this reduction is promoted, channeling arising in the <110>-oriented zone axis allows arsenic ions to enter even into the diffused channel layer 102 located below the gate electrode 104. Thus, the arsenic ions having entered also come to affect the short channel characteristics of the device.

As is apparent from the above, it is extremely difficult for the conventional method for fabricating a semiconductor device to form the diffused source and drain layers having a shallow junction and high impurity concentration essential to miniaturization of MIS transistors so that the layers have a desired impurity concentration and concurrently entry of an impurity ion and impurity distribution of the diffused extension layer by TED are minimized.

In view of the conventional problems, an object of the present invention is to miniaturize a semiconductor device by minimizing manifestation of short channel effect (and reverse short channel effect) accompanied with the miniaturization and concurrently allowing the shapes of diffused source and drain layers to be made shallow in the depth direction and small in the lateral direction.

To attain the above object, in the present invention, a method for fabricating a semiconductor device is designed so that an impurity having a conductivity type opposite to the conductivity type of source and drain regions is implanted into the source and drain regions and then thermal treatment is performed to make an impurity diffusion with impurity pairs (ion pairs) of n-type and p-type impurities produced, thereby forming the source and drain region of low resistance with a thermal budget reduced. By this method, the formed semiconductor device includes in the source and drain region an impurity diffused layer of a conductivity type opposite to the conductivity type of the source and drain regions. Note that "thermal budget" refers to the amount of thermal treatment represented by the product of the heating temperature and the heating time.

To be more specific, a semiconductor device according to the present invention is characterized by comprising: a semiconductor layer of a first conductivity type; a gate insulating film formed on the semiconductor layer; a gate electrode formed on the gate insulating film; and diffused source and drain layers of a second conductivity type formed in regions of the semiconductor layer located below sides of the gate electrode, respectively. This device is also characterized in that insides of the diffused source and drain layers are formed with impurity implanted regions of the first conductivity type having a lower impurity concentration than the diffused source and drain layers.

In the semiconductor device of the present invention, insides of the diffused source and drain layers of the second conductivity type are formed with the impurity implanted regions of the first conductivity type having a lower impurity concentration than the diffused source and drain layer. By this, in thermally diffusing the impurity ion of the second conductivity type implanted for formation of the diffused source and drain layer, the impurity ion of the second conductivity type combines with the impurity ion of the first conductivity type implanted into the impurity implanted region to produce an ion pair, thereby suppressing transient enhanced diffusion. Thus, the junction depth of the diffused source and drain layer becomes shallow to miniaturize the semiconductor device with manifestation of short channel effect minimized.

Preferably, the semiconductor device of the present invention further comprises: diffused extension layers of the second conductivity type formed in regions of the semiconductor layer located below the sides of the gate electrode and between the diffused source and drain layers, respectively; and diffused pocket layers of the first conductivity type formed in regions of the semiconductor substrate located below the diffused extension layers, respectively, and the impurity concentration of the impurity implanted region is higher than that of the diffused pocket layer.

Preferably, the semiconductor device of the present invention further comprises a diffused channel layer of the first conductivity type formed in a region of the semiconductor layer located below the gate electrode, and the impurity concentration of the impurity implanted region is higher than that of the diffused channel layer.

Preferably, in the semiconductor device of the present invention, the impurity of the second conductivity type forming the diffused source and drain layers is arsenic, and the impurity of the first conductivity type forming the impurity implanted region is indium.

Preferably, in the semiconductor device of the present invention, the diffused source and drain layers contain an element belonging to the group IV at a higher concentration than that of the semiconductor layer located below the gate electrode.

A method for fabricating a semiconductor device according to the present invention is characterized by comprising: the step (a) of sequentially forming a gate insulating film and a gate electrode on a semiconductor layer of a first conductivity type; the step (b) of forming sidewalls on side surfaces of the gate electrode; the step (c) of subjecting the semiconductor layer to ion implantation of a first impurity of the first conductivity type using the gate electrode and the sidewalls as a mask, thereby forming impurity implanted layers of the first conductivity type in regions of the semiconductor layer located below sides of the sidewalls; the step (d) of subjecting the semiconductor layer to ion implantation of a second impurity of a second conductivity type using the gate electrode and the sidewalls as a mask, thereby forming implanted source and drain layers of the second conductivity type in regions of the semiconductor layer located below the sides of the sidewalls; and the step (e) of subjecting, after the steps (c) and (d), the semiconductor layer to a first thermal treatment, thereby diffusing the second impurity to form diffused source and drain layers of the second conductivity type in regions of the semiconductor layer located below the sides of the sidewalls. This device is also characterized in that in the step (e), insides of the diffused source and drain layers are formed with impurity implanted regions of the first conductivity type, respectively, which are made by diffusing the first impurity with a lower impurity concentration than that of the diffused source and drain layers.

The method for fabricating a semiconductor device according to the present invention includes not only the step (d) of implanting the second impurity of the second conductivity type to form the implanted source and drain layers of the second conductivity type, but also the step (c) of implanting the first impurity of the first conductivity type to form the impurity implanted layers. Therefore, in the subsequent first thermal treatment step (e), the first and second impurities having different conductivity types produce an impurity pair (ion pair). By producing an ionized pair (positive and negative ions) having polarities opposite to each other, the produced impurity pair is electrically neutral and difficult to diffuse. This suppresses transient enhanced diffusion of the second impurity. As a consequence of this, the diffused source and drain layers can be formed which have shallower junctions than the case where only the second impurity is implanted.

Preferably, the method for fabricating a semiconductor device according to the present invention further comprises, after the step (a) and before the step (b), the step (f) of subjecting the semiconductor layer to ion implantation of a third impurity of the second conductivity type using the gate electrode as a mask, thereby forming implanted extension layers of the second conductivity type in regions of the semiconductor layer located below sides of the gate electrode, the step (g) of subjecting regions of the semiconductor layer located below the sides of the gate electrode to ion implantation of a fourth impurity of the first conductivity type using the gate electrode as a mask, thereby forming implanted pocket layers of the first conductivity type in the semiconductor layer, and the step (h) of subjecting, after the steps (f) and (g), the semiconductor layer to a second thermal treatment, thereby diffusing the third impurity to form diffused extension layers of the second conductivity type in regions of the semiconductor layer located below the sides of the gate electrode, and simultaneously diffusing the fourth impurity to form diffused pocket layers of the first conductivity type in regions of the semiconductor layer located below the diffused extension layers, and the impurity concentration of the impurity implanted region is higher than that of the diffused pocket layer. With this method, the diffused extension layers having the same conductivity type as the diffused source and drain layers are formed in regions of the semiconductor layer located below the sides of the gate electrode, and the diffused pocket layers having the opposite conductivity type to the diffused source and drain layers are formed below the diffused extension layers. This reduces the resistance between the source and the drain, and limits expansion of a depletion layer in the channel region formed below the gate electrode.

Preferably, the method for fabricating a semiconductor device according to the present invention further comprises, before the step (a), the step (i) of subjecting the semiconductor layer to ion implantation of a fifth impurity of the first conductivity type to form an implanted channel layer of the first conductivity type in the semiconductor layer, and then subjecting the semiconductor layer to a third thermal treatment, thereby diffusing the fifth impurity to form a diffused channel layer of the first conductivity type in the semiconductor layer, and the impurity concentration of the impurity implanted region is higher than that of the diffused channel layer.

Preferably, the method for fabricating a semiconductor device according to the present invention further comprises, after the step (b) and before the steps (c) and (d), the step (j) of subjecting the semiconductor layer to ion implantation of a sixth impurity using the gate electrode and the sidewalls as a mask, thereby forming amorphous layers in regions of the semiconductor layer located below sides of the sidewalls. With this method, the second impurity for the source and drain formation carried out in the step (d) can be prevented from channeling in the depth direction of the semiconductor layer. Furthermore, in the case where the semiconductor layer is made of, for example, silicon, the second impurity can also be prevented from entering into the region below the gate electrode resulting from channeling in the <110>-oriented zone axis.

Preferably, in this case, in the step (j), the sixth impurity is implanted by angled implantation having a predetermined angle with respect to the normal to a main surface of the semiconductor layer. With this method, channeling in the <110>-oriented zone axis can be suppressed more certainly.

Preferably, in the method for fabricating a semiconductor device according to the present invention, the sixth impurity is a group IV element. With this method, in the case where the semiconductor layer is made of silicon, when the semiconductor layer is amorphized with the group IV element, the group IV element never exerts an electrical influence on the semiconductor layer after amorphization of the semiconductor layer. This is because the group IV element is electrically neutral.

Preferably, in the method for fabricating a semiconductor device according to the present invention, ion implantation of the second impurity is conducted at an implantation projected range equal to or larger than the implantation projected range of the first impurity.

Preferably, in the method for fabricating a semiconductor device according to the present invention, the first impurity is indium.

Preferably, the method for fabricating a semiconductor device according to the present invention further comprises, after the step (d) and before the step (e), the step (k) of performing an extremely low-temperature thermal treatment of a level at which the implanted impurity does not diffuse, thereby restoring crystal damages due to the ion implantation.

Preferably, in this case, the heating temperature of the extremely low-temperature thermal treatment is from 400 to 700° C. inclusive. Such a low heating temperature range from 400 to 700° C. inclusive is a temperature range in which solid phase epitaxial regrowth (SPER) of the amorphous layer occurs. Therefore, in this range, substantially only restoration of crystal damages can be carried out with the impurity ions hardly diffused.

Preferably, the method for fabricating a semiconductor device according to the present invention further comprises, the step (l) of removing, after the step (e), the sidewalls and then subjecting the semiconductor layer to ion implantation of a third impurity of the second conductivity type using the gate electrode as a mask, thereby forming implanted extension layers of the second conductivity type in regions of the semiconductor layer located below sides of the gate electrode; the step (m) of subjecting the semiconductor layer to ion implantation of a fourth impurity of the first conductivity type using the gate electrode as a mask, thereby forming implanted pocket layers of the first conductivity type in regions of the semiconductor layer located below the sides of the gate electrode; and the step (n) of subjecting, after the steps (l) and (m), the semiconductor layer to a second thermal treatment, thereby diffusing the third impurity to form diffused extension layers of the second conductivity type in regions of the semiconductor layer located below the sides of the gate electrode, and simultaneously diffusing the fourth impurity to form diffused pocket layers of the first conductivity type in regions of the semiconductor layer located below the diffused extension layers, and the impurity concentration of the impurity implanted region is higher than that of the diffused pocket layer.

As described above, in this method, the sidewalls are selectively removed after formation of the diffused source and drain layers, and then the diffused extension layers are formed using the gate electrode as a mask. Therefore, unlike the case where the diffused extension layers are formed previously, this method can avoid the situation in which by the thermal treatment in the step (e) of activating the impurity for source and drain formation, redistribution occurs in the impurity contained in the diffused extension layer, thereby making the junction depth thereof deep.

DETAILED DESCRIPTION OF THE PREFERRED EMBODIMENTS

First Embodiment

A first embodiment of the present invention will be described with reference to the accompanying drawings.

Figure 1:
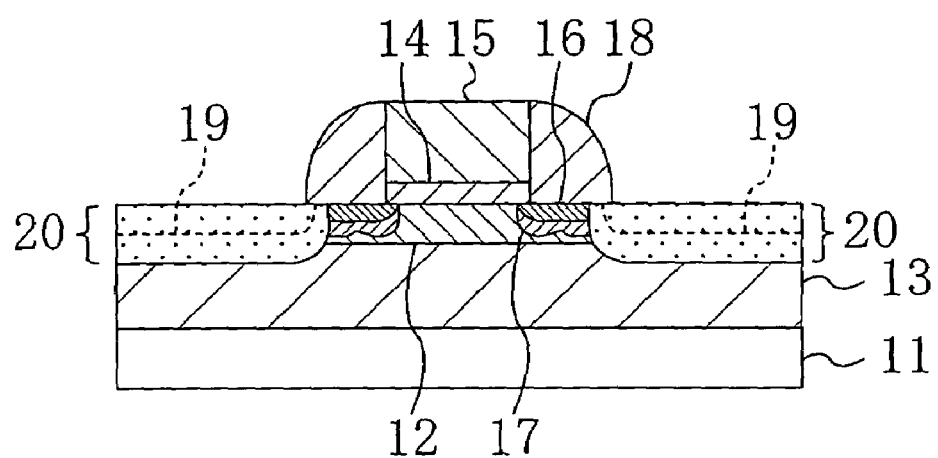
FIG. 1 is a sectional view showing the structure of a semiconductor device according to a first embodiment of the present invention.

FIG. 1 is a view of a semiconductor device according to the first embodiment of the present invention, which shows a cross-sectional structure of an n-channel type MIS transistor.

Referring to FIG. 1, a gate insulating film 14 is selectively formed on a main surface of a semiconductor substrate 11 of, for example, p-type silicon, and a gate electrode 15 is selectively formed on the gate insulating film 14. Insulating sidewalls 18 are formed on both side surfaces of the gate insulating film 14 and the gate electrode 15.

A p-type diffused channel layer 12 is formed in a region of the semiconductor substrate 11 located below the gate insulating film 14. N-type diffused extension layers 16 are selectively formed in regions of the semiconductor substrate 11 located below the sidewalls 18, respectively, and p-type diffused pocket layers 17 are selectively formed below the n-type diffused extension layers 16, respectively.

In regions of the semiconductor substrate 11 located below sides of the sidewalls 18, n-type diffused source and drain layers 20 are formed to have deeper junctions than the p-type diffused channel layer 12 and to connect inner edges thereof to the n-type diffused extension layers 16 and the p-type diffused pocket layers 17, respectively.

The first embodiment is characterized in that insides of the n-type diffused source and drain layers 20 are formed with p-type impurity implanted regions 19, respectively, made by implanting a p-type impurity with a lower impurity concentration than the concentration of the impurity contained in the n-type diffused source and drain layers 20. In this embodiment, for example, arsenic (As) is introduced into the n-type diffused source and drain layers 20, while, for example, indium (In) is implanted into the p-type impurity implanted region 19. The impurity concentration of the p-type impurity implanted region 19 is set higher than those of the p-type diffused channel layer 12 and the p-type diffused pocket layer 17.

As described above, in the semiconductor device according to the first embodiment, the insides of the n-type diffused source and drain layers 20 are formed with the p-type impurity implanted regions 19 having a lower p-type impurity concentration than the impurity concentration of the n-type diffused source and drain layers 20. Thus, when arsenic ions implanted to form the n-type diffused source and drain layers 20 are thermally diffused, the arsenic ions serving as a donor and indium ions serving as an acceptor produce ion pairs electrically neutral. By this, it becomes difficult for the indium ions to diffuse, so that the n-type diffused source and drain layers 20 having shallow junctions can be formed. Since the junctions of the n-type diffused source and drain layers 20 can be made shallow, miniaturization of the MIS transistor can be attained.

A fabrication method of the MIS transistor constructed above will be described below with reference to the accompanying drawings.

FIGS. 2A to 2E and FIGS. 3A to 3D show sectional structures of the fabrication method of a semiconductor device according to the first embodiment of the present invention in the order of its fabrication process steps.

Figure 2A:
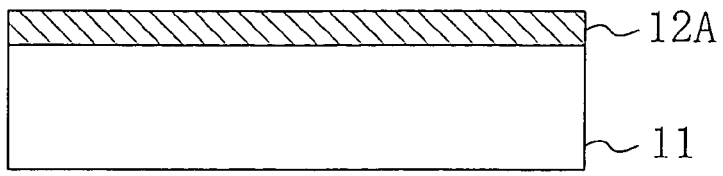
FIGS. 2A to 2E are sectional views showing a method for fabricating a semiconductor device according to the first embodiment of the present invention in the order of its fabrication process steps.

First, in the step shown in FIG. 2A, into a channel formation region of the semiconductor substrate 11 made of p-type silicon, indium (In) ions serving as a p-type impurity are implanted on an implantation condition of an implantation energy of 70 keV and a dose of $8 \times 10^{12}$ ions/cm$^2$. Thereby, a p-type implanted channel layer 12A is formed in the upper portion of the semiconductor substrate 11.

Figure 2B:
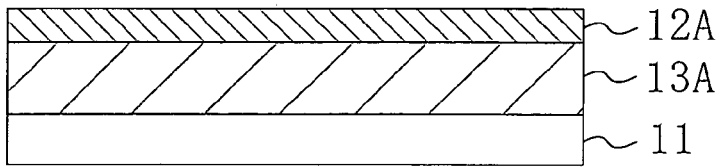

Next, in the step shown in FIG. 2B, on a p-well formation region of the semiconductor substrate 11, a first ion implantation of boron (B) ions serving as a p-type impurity is conducted on a first implantation condition of an implantation energy of 100 keV and a dose of $1 \times 10^{13}$ ions/cm$^2$. Subsequently, a second ion implantation thereof is conducted on a second implantation condition of an implantation energy of 250 keV and a dose of $1 \times 10^{13}$ ions/cm$^2$. Thereby, a p-type implanted well layer 13A is formed in a region of the semiconductor substrate 11 located below the p-type implanted channel layer 12A. Note that the ion implantation into the channel layer may be conducted using a so-called rotating implantation made in such a manner that the dose is divided into smaller doses and the divided doses of impurity ions are implanted symmetrically within the wafer surface, at different implantation angles, and in several times. In the first embodiment, the implantation into the channel layer is conducted before the implantation into the well layer, but the implantation into the well layer may be conducted before the implantation into the channel layer.

Figure 2C:
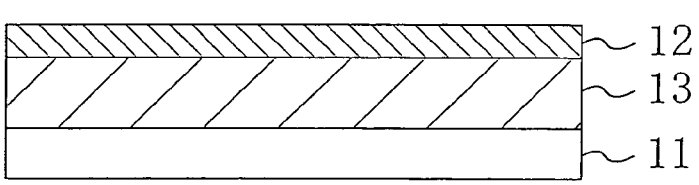

In the step shown in FIG. 2C, subsequently to the formation of the p-type implanted channel layer 12A and the p-type implanted well layer 13A, the semiconductor substrate 11 is heated to about 850 to 1050° C. at a heating rate of about 100° C./sec or more, preferably at a heating rate of about 200° C./sec. After the heating, a first rapid thermal annealing (RTA) is performed either with the peak temperature thereof kept for about 10 seconds at the maximum or with the peak temperature not kept. This RTA forms the p-type diffused channel layer 12 and a p-type diffused well layer 13 in the upper portion of the semiconductor substrate 11. Note that the RTA with the peak temperature not kept means that the thermal treatment temperature is lowered on reaching the peak temperature.

Figure 2D:
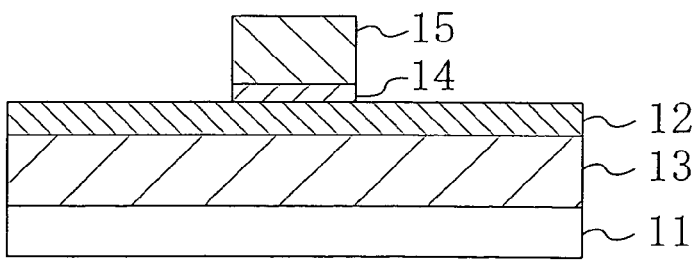

Subsequently, in the step shown in FIG. 2D, the gate insulating film 14 of silicon oxide having a thickness of about 1.5 nm is selectively formed on the main surface of the semiconductor substrate 11. On the gate insulating film 14, the gate electrode 15 is selectively formed which is made of polysilicon or polymetal having a thickness of about 150 nm.

Figure 2E:
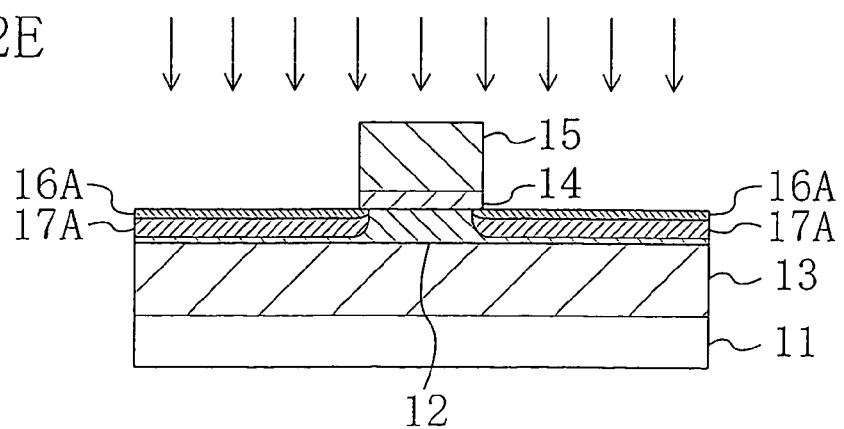

In the step shown in FIG. 2E, using the gate electrode 15 as a mask, arsenic (As) ions serving as an n-type impurity are implanted into the semiconductor substrate 11 on an implantation condition of an implantation energy of 2 keV and a dose of $2 \times 10^{14}$ ions/cm$^2$, thereby forming n-type implanted extension layers 16A. Further, using the gate electrode 15 as a mask, boron (B) ions serving as a p-type impurity are implanted into the semiconductor substrate 11 on an implantation condition of an implantation energy of 10 keV and a dose of $1 \times 10^{13}$ ions/cm$^2$, thereby forming p-type implanted pocket layers 17A.

Figure 3A:
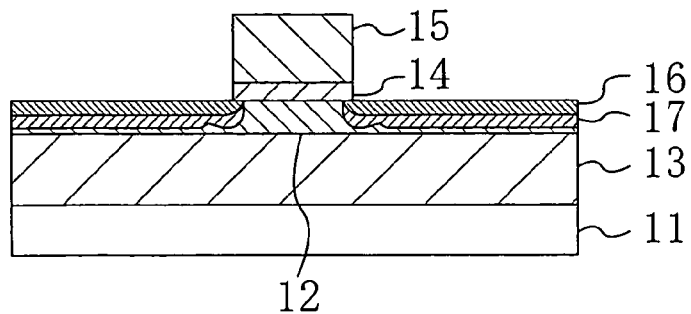
FIGS. 3A to 3D are sectional views showing the method for fabricating a semiconductor device according to the first embodiment of the present invention in the order of its fabrication process steps.

Next, in the step shown in FIG. 3A, the semiconductor substrate 11 is heated to about 850 to 1050° C. at a heating rate of about 200° C./sec. After the heating, a second rapid thermal annealing is performed either with the peak temperature thereof kept for about 10 seconds at the maximum or with the peak temperature not kept. The second rapid thermal annealing activates arsenic ions contained in the n-type implanted extension layers 16A to form, in regions of the semiconductor substrate 11 located below both sides of the gate electrode 15, the n-type diffused extension layers 16 having relatively shallow junctions. This annealing also activates boron ions contained in the p-type implanted pocket layers 17A to form, below the n-type diffused extension layers 16, the p-type diffused pocket layers 17 having a higher impurity concentration than the p-type diffused channel layer 13.

Figure 3B:
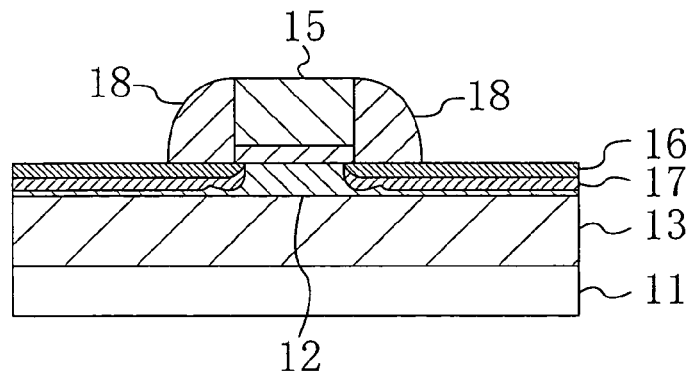

In the step shown in FIG. 3B, by chemical vapor deposition (CVD) or the like, a silicon nitride film having a thickness of about 50 nm is deposited over the entire surface of the semiconductor substrate 11 including the gate electrode 15. The deposited silicon nitride film is anisotropically etched to form the sidewalls 18 of silicon nitride on the side surfaces of the gate electrode 15. The sidewalls 18 may be made not of silicon nitride but of a single-layer film of silicon oxide, a laminate film composed of a silicon oxide film having an L-shaped cross section and a silicon nitride film having a plate-like cross section on the silicon oxide film, or the like. An offset spacer may be formed between each of the sidewalls 18 and the gate electrode 15.

Figure 3C:
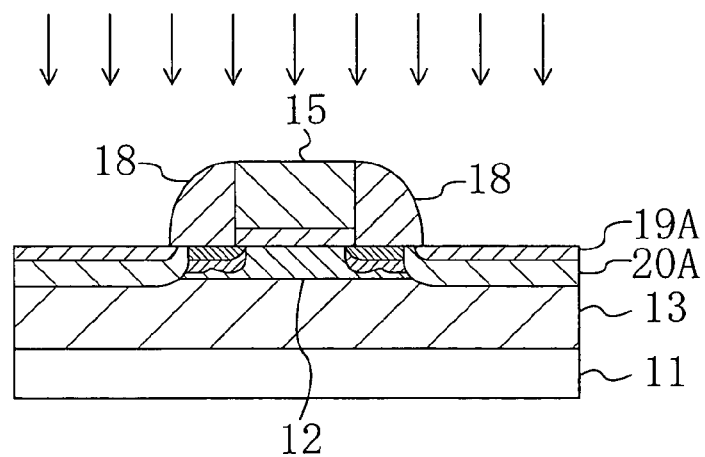

Thereafter, in the step shown in FIG. 3C, using the gate electrode 15 and the sidewalls 18 as a mask, indium ions serving as a p-type impurity are implanted into the semiconductor substrate 11 on an implantation condition of an implantation energy of 10 keV and a dose of $1 \times 10^{14}$ ions/cm$^2$, thereby forming p-type ion implanted layers 19A. Subsequently, using the gate electrode 15 and the sidewalls 18 as a mask, arsenic ions serving as an n-type impurity are implanted into the semiconductor substrate 11 on an implantation condition of an implantation energy of 15 keV and a dose of $3 \times 10^{15}$ ions/cm$^2$, thereby forming n-type implanted source and drain layers 20A. Into the n-type implanted source and drain layers 20A, arsenic ions are implanted which have a deeper implantation depth and a higher concentration than the p-type ion implanted layer 19A. Although not shown, in order to release an electric field in the source and drain region, phosphorus (P) ions serving as an n-type impurity may be additionally implanted after the implantation of arsenic ions on an implantation condition of an implantation energy of 20 keV and a dose of $1 \times 10^{13}$ ions/cm$^2$. Since the surface of the semiconductor substrate 11 and its vicinity are amorphized by the implantations of indium and a high dose of arsenic, the subsequent implantation of phosphorus ions for releasing the electric field has an implantation profile with a channeling greatly suppressed by the pre-amorphous effect. For the n-type implanted source and drain layers 20A, use may be made of phosphorus ions instead of arsenic ions.

Figure 3D:
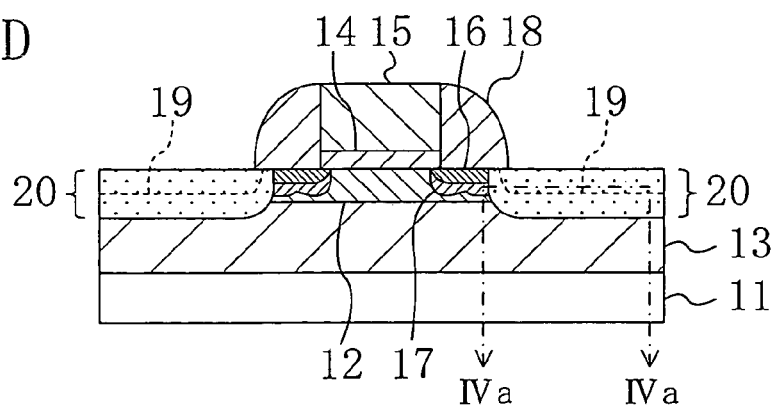

In the step shown in FIG. 3D, the semiconductor substrate 11 is heated to about 850 to 1000° C. at a heating rate of about 200 to 250° C./sec. After the heating, a third rapid thermal annealing is performed either with the peak temperature thereof kept for about 10 seconds at the maximum or with the peak temperature not kept. The third rapid thermal annealing activates arsenic ions contained in the n-type implanted source and drain layers 20A to form, in regions of the semiconductor substrate 11 located below the sides of the sidewalls 18, the n-type diffused source and drain layers 20. By the formation of the n-type diffused source and drain layers 20, the n-type diffused extension layers 16 and the p-type diffused pocket layers 17 are also formed between the p-type diffused channel layer 12 below the gate electrode 15 and the n-type diffused source and drain layers 20. Each of the n-type diffused source and drain layers 20 has a junction connected to the n-type diffused extension layer 16 and made deeper than the n-type diffused extension layer 16. In this state, inside each of the n-type diffused source and drain layers 20, the p-type impurity implanted region 19 shown by the broken curve is embedded which is formed from the p-type ion implanted layer 19A. The p-type impurity concentration of the p-type impurity implanted region 19 is lower than the n-type impurity concentration of the n-type diffused source and drain layers 20, so that the p-type impurity implanted region 19 will not be formed in the structure of a p-type impurity diffused layer.

Figure 4A:
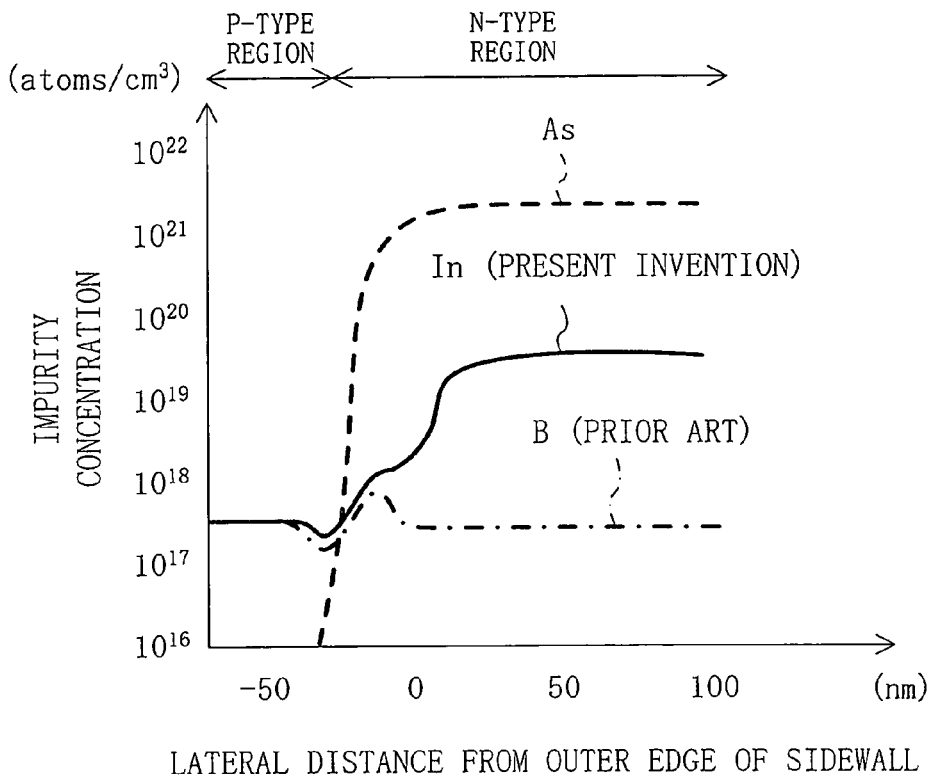
FIG. 4A is a graph showing the lateral impurity concentration profile of a portion of an n-type diffused source/drain layer which is taken along the line IVa—IVa in FIG. 2D.

FIG. 4A shows the lateral (the parallel direction with the substrate surface) impurity concentration profile of a portion of the n-type diffused source/drain layer 20 which is taken along the line IVa—IVa in FIG. 3D. FIG. 4A plots the logarithm of the impurity concentration in ordinate and the distance from the outer edge of the sidewall in abscissa. In FIG. 4A, the solid curve represents the concentration of indium contained in the p-type impurity region 19 and implanted into the source and drain formation region according to the present invention, while the broken curve represents the concentration of arsenic contained in the n-type diffused source and drain layers 20. For comparison purposes, the concentration of boron introduced into the source and drain formation region during the conventional formation of the diffused pocket layer is represented by the alternate long and short dashed curve. As shown in FIG. 4A, indium that is a p-type impurity for the p-type impurity region 19 introduced within the n-type diffused source and drain layers 20 has a higher concentration than boron introduced by the conventional formation of the p-type diffused pocket layer. This indium interacts with arsenic to suppress arsenic diffusion. Note that FIG. 4A shows only the indium concentration as the present invention. However, in actuality, boron implantation forms the p-type diffused pocket layer 17 similarly to the conventional example, so that the sum of the indium concentration and the boron concentration of the p-type diffused pocket layer 17 is the total concentration of the p-type impurity in this portion.

As described above, according to the first embodiment, in the step shown in FIG. 3C, the n-type implanted source and drain layers 20A for forming the n-type diffused source and drain layers 20 and the p-type ion implanted layers 19A having a lower impurity concentration than the n-type implanted source and drain layers 20A are formed, and then in the step shown in FIG. 3D, the third rapid thermal annealing for activating arsenic ions in the n-type implanted source and drain layers 20A and indium ions in the p-type ion implanted layer 19A is performed. Since, in this treatment, the impurity concentration of the n-type implanted source and drain layers 20A is higher than that of the p-type ion implanted layer 19A, the n-type diffused source and drain layers 20 can be formed certainly.

Ionized donor and acceptor atoms have the property of being electrically attracted to each other by thermal treatment to produce an ion pair. By this property, ionized arsenic in the n-type implanted source and drain layers 20A and ionized indium in the p-type ion implanted layer 19A produce an ion pair, which suppresses transient enhanced diffusion of arsenic. Therefore, a diffusion layer can be formed which has a shallower junction than the case where only an n-type impurity is implanted.

Figure 4B:
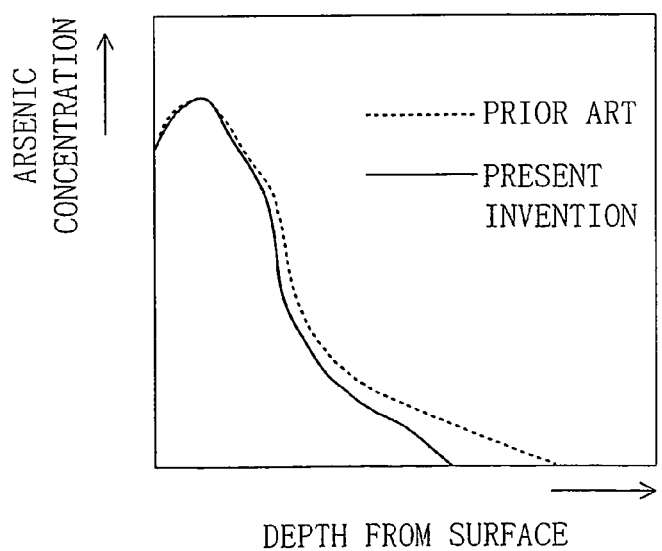
FIG. 4B is a graph showing results of simulations of impurity profiles of arsenic obtained after thermal treatment and from processes with and without indium implantation for producing ion pairs.

FIG. 4B shows results of simulations of the impurity profiles of arsenic obtained after the thermal treatment and from the processes with and without the indium implantation for producing ion pairs. From FIG. 4B, it is found that since indium for forming ion pairs is implanted in the present invention, the junction of arsenic in the present invention is shallower than that of the conventional case where indium for forming ion pairs is not implanted.

Thus, the ion pair of arsenic and indium suppresses arsenic diffusion, which eliminates the necessity to set the thermal treatment for activation for forming the n-type diffused source and drain layers 20 at a temperature higher than required. Moreover, in the thermal treatment step, the time for which the heated state is kept can be reduced, so that the activation process can be carried out with a low thermal budget. Furthermore, the step of activating the impurity for source and drain formation can be carried out with a low thermal budget, which also avoids the conventional drawback that by the thermal treatment in this step, redistribution of the impurity occurs in the diffused extension layer having once been formed shallowly, thereby making the junction thereof deep.

Moreover, an element with a relatively large mass number, such as indium, is used as a p-type impurity for combining with an impurity for source and drain formation to produce an ion pair. Therefore, even at a low dose, the source and drain formation region of the semiconductor substrate 11 can be amorphized. Thus, by implanting indium for ion pair production prior to the ion implantation of arsenic for source and drain region formation, the implanted indium ions also serve as an impurity for implantation for pre-amorphization. This pre-amorphous effect suppresses channeling of arsenic to be implanted subsequently, so that the implantation profile of arsenic can be made shallow. During restoration of the crystal of the amorphous layer, the layer is in the meta-stable state in which the solubility limit of the contained impurity is higher than that of the impurity contained in the crystal layer. Consequently, by this pre-amorphous effect, the impurity profile of arsenic created by the thermal diffusion for activation can obtain a shallow junction.

It is known that indium strongly segregates to a dislocation loop defect layer. Therefore, by forming the p-type ion implanted layers 19A with indium ions implanted therein within the n-type implanted source and drain layers 20A with arsenic ions implanted, the indium is trapped into the dislocation loop defect layer. This suppresses transient enhanced diffusion of arsenic caused by releasing interstitial silicon from the dislocation loop defect layer.

As is apparent from the above, with the method for fabricating a semiconductor device according to the first embodiment, the n-type diffused source and drain layers 20 with a shallow junction can be formed certainly while redistribution of the impurity in the n-type diffused extension layer 16 is suppressed.

Moreover, indium ions with a relatively large mass number are used for formation of the p-type diffused channel layer 12. Therefore, a region of the p-type diffused channel layer 12 located around the substrate surface has a decreased impurity concentration, while a region thereof located slightly deeper than the substrate surface has an increased impurity concentration. That is to say, a retrograde impurity profile can be provided in this layer. This prevents a decrease in carrier mobility mainly resulting from impurity dispersion and therefore minimizes manifestation of short channel effect. As a result, the transistor in the device can be miniaturized reliably.

Second Embodiment

A second embodiment of the present invention will be described below with reference to the accompanying drawings.

FIGS. 5A to 5E and FIGS. 6A to 6E show sectional structures of a fabrication method of a semiconductor device according to the second embodiment of the present invention in the order of its fabrication process steps. Also in the second embodiment, description will be made using an n-channel type MIS transistor.

Figure 5A:
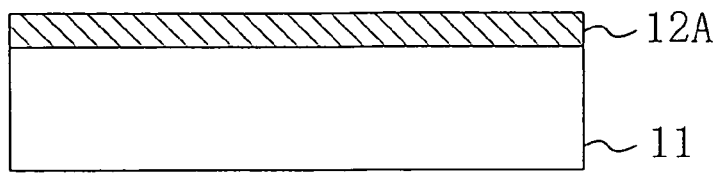
FIGS. 5A to 5E are sectional views showing process steps of a method for fabricating a semiconductor device according to a second embodiment of the present invention.

First, in the step shown in FIG. 5A, into a channel formation region of a semiconductor substrate 11 made of p-type silicon, indium (In) ions serving as a p-type impurity are implanted on an implantation condition of an implantation energy of 70 keV and a dose of $8 \times 10^{12}$ ions/cm². Thereby, a p-type implanted channel layer 12A is formed.

Figure 5B:
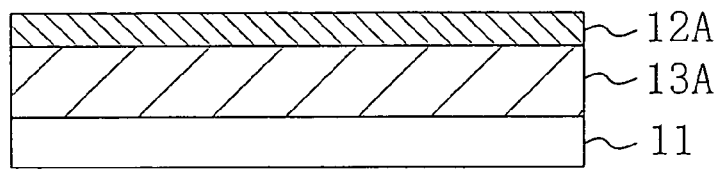

Next, in the step shown in FIG. 5B, on a p-well formation region of the semiconductor substrate 11, a first ion implantation of boron (B) ions serving as a p-type impurity is conducted on a first implantation condition of an implantation energy of 100 keV and a dose of $1 \times 10^{13}$ ions/cm². Subsequently, a second ion implantation thereof is conducted on a second implantation condition of an implantation energy of 250 keV and a dose of $1 \times 10^{13}$ ions/cm². Thereby, a p-type implanted well layer 13A is formed in a region of the semiconductor substrate 11 located below the p-type implanted channel layer 12A. Note that the ion implantation into the channel layer may be conducted using a so-called rotating implantation made in such a manner that the dose is divided into smaller doses and the divided doses of impurity ions are implanted symmetrically within the wafer surface, at different implantation angles, and in several times. In the second embodiment, the implantation into the channel layer is conducted before the implantation into the well layer, but the implantation into the well layer may be conducted before the implantation into the channel layer.

In the step shown in FIG. 5C, subsequently to the formation of the p-type implanted channel layer 12A and the p-type implanted well layer 13A, the semiconductor substrate 11 is heated to about 850 to 1050° C. at a heating rate of about 100° C./sec or more, preferably at a heating rate of about 200° C./sec. After the heating, a first rapid thermal annealing (RTA) is performed either with the peak temperature thereof kept for about 10 seconds at the maximum or with the peak temperature not kept. This RTA forms a p-type diffused channel layer 12 and a p-type diffused well layer 13 in the upper portion of the semiconductor substrate 11.

Subsequently, in the step shown in FIG. 5D, a gate insulating film 14 of silicon oxide having a thickness of about 1.5 nm is selectively formed on the semiconductor substrate 11. On the gate insulating film 14, a gate electrode 15 is selectively formed which is made of polysilicon or polymetal having a thickness of about 150 nm.

Figure 5C:
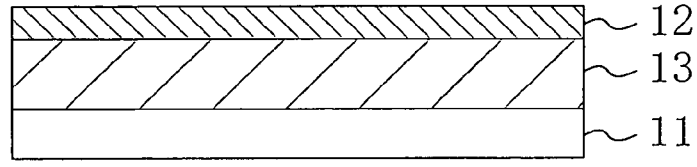
Figure 5D:
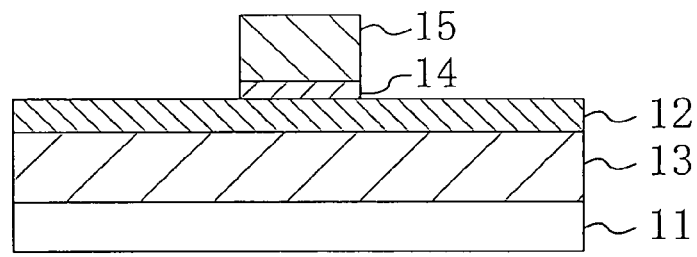
Figure 5E:
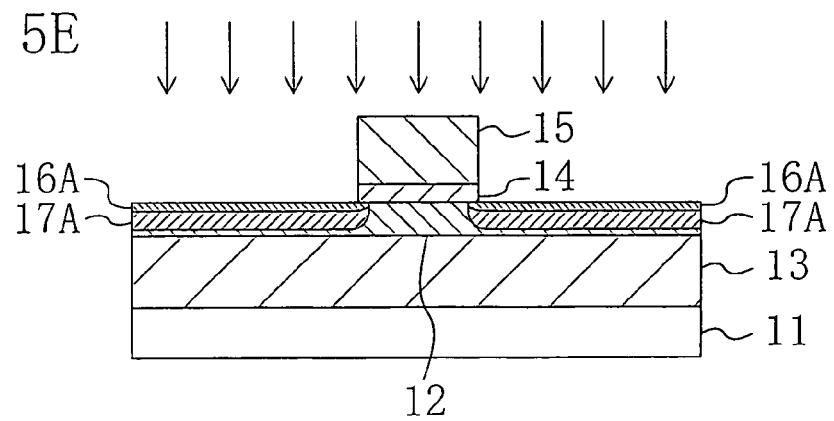

In the step shown in FIG. 5E, using the gate electrode 15 as a mask, arsenic (As) ions serving as an n-type impurity are implanted into the semiconductor substrate 11 on an implantation condition of an implantation energy of 2 keV and a dose of $2 \times 10^{14}$ ions/cm², thereby forming n-type implanted extension layers 16A. Further, using the gate electrode 15 as a mask, boron ions serving as a p-type impurity are implanted into the semiconductor substrate 11 on an implantation condition of an implantation energy of 10 keV and a dose of $1 \times 10^{13}$ ions/cm², thereby forming p-type implanted pocket layers 17A.

Figure 6A:
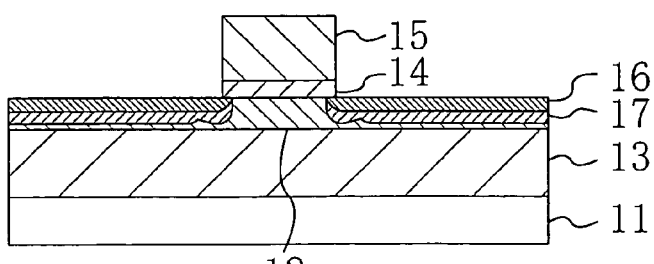
FIGS. 6A to 6E are sectional views showing process steps of the method for fabricating a semiconductor device according to the second embodiment of the present invention.

Next, in the step shown in FIG. 6A, the semiconductor substrate 11 is heated to about 850 to 1050° C. at a heating rate of about 200° C./sec. After the heating, a second rapid thermal annealing is performed either with the peak temperature thereof kept for about 10 seconds at the maximum or with the peak temperature not kept. The second rapid thermal annealing activates arsenic ions contained in the n-type implanted extension layers 16A to form, in regions of the semiconductor substrate 11 located below both sides of the gate electrode 15, n-type diffused extension layers 16 having relatively shallow junctions. This annealing also activates boron ions contained in the p-type implanted pocket layers 17A to form, below the n-type diffused extension layers 16, p-type diffused pocket layers 17 having a higher impurity concentration than the p-type diffused channel layer 13.

Figure 6B:
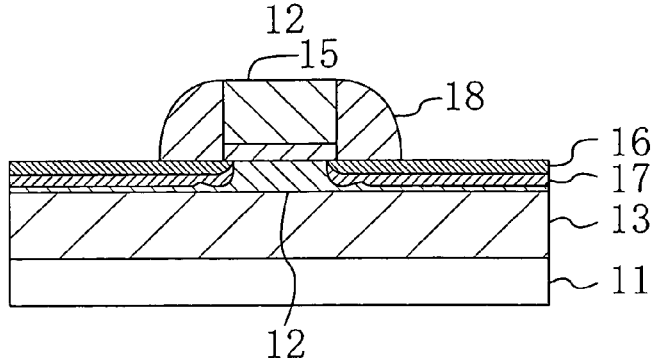

In the step shown in FIG. 6B, by a CVD method or the like, a silicon nitride film having a thickness of about 50 nm is deposited over the entire surface of the semiconductor substrate 11 including the gate electrode 15. The deposited silicon nitride film is anisotropically etched to form sidewalls 18 of a silicon nitride film on the side surfaces of the gate electrode 15. The sidewalls 18 may be made not of a silicon nitride film but of a single-layer film of silicon oxide, a laminate film composed of a silicon oxide film having an L-shaped cross section and a silicon nitride film having a plate-like cross section on the silicon oxide film, or the like. An offset spacer may be formed between each of the sidewalls 18 and the gate electrode 15.

Figure 6C:
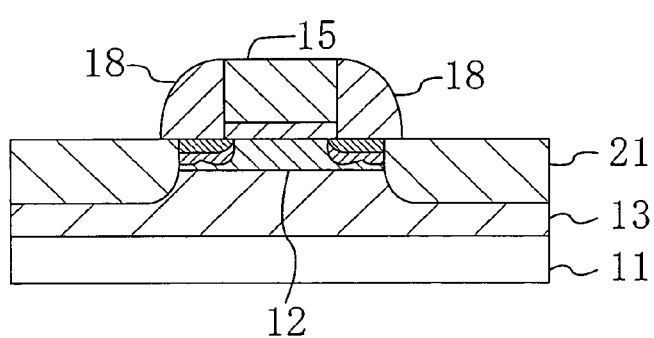

Next, in the step shown in FIG. 6C, using the gate electrode 15 and the sidewalls 18 as a mask, germanium (Ge) ions belonging to the group IV are implanted into the semiconductor substrate 11 on an implantation condition of an implantation energy of 100 keV and a dose of $1 \times 10^{15}$ ions/cm², thereby forming amorphous layers 21 in the source and drain formation regions of the semiconductor substrate 11, respectively. The amorphous layers 21 are desirably formed to have deeper depths than implanted source and drain layers that will be formed in a later step. In this formation, the group IV element, other than germanium, forming the amorphous layer 21 may be silicon (Si) that has no electrical influence on the semiconductor substrate 11 as in the case of using germanium. If, in this step, silicon is used to form the amorphous layer 21, the concentration of implanted silicon is added to the silicon concentration of the semiconductor substrate 11. Therefore, the silicon concentration of the region forming the amorphous layer 21 is higher than that of the region of the semiconductor substrate 11 located immediately below the gate electrode 15.

Figure 6D:
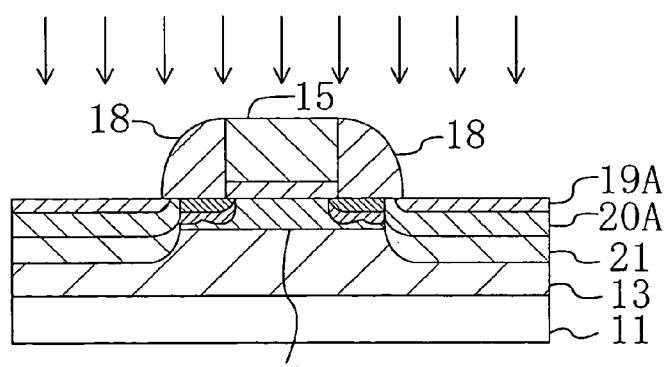

Thereafter, in the step shown in FIG. 6D, using the gate electrode 15 and the sidewalls 18 as a mask, indium ions serving as a p-type impurity are implanted into the amorphous layers 21 formed in the semiconductor substrate 11 on an implantation condition of an implantation energy of 10 keV and a dose of $1 \times 10^{14}$ ions/cm², thereby forming p-type ion implanted layers 19A. Subsequently, using the gate electrode 15 and the sidewalls 18 as a mask, arsenic ions serving as an n-type impurity are implanted into the amorphous layers 21 formed in the semiconductor substrate 11 on an implantation condition of an implantation energy of 15 keV and a dose of $3 \times 10^{15}$ ions/cm², thereby forming n-type implanted source and drain layers 20A. Into the n-type implanted source and drain layers 20A, arsenic ions are implanted which have a deeper implantation depth and a higher concentration than the p-type ion implanted layer 19A. Although not shown, in order to release an electric field in the source and drain region, phosphorus (P) ions serving as an n-type impurity may be additionally implanted after the implantation of arsenic ions on an implantation condition of an implantation energy of 20 keV and a dose of $1 \times 10^{13}$ ions/cm². Since the amorphous layer 21 is formed in the semiconductor substrate 11, the implantation of phosphorus ions for releasing the electric field has an implantation profile with a channeling greatly suppressed by the pre-amorphous effect. For the n-type implanted source and drain layers 20A, use may be made of phosphorus ions instead of arsenic ions.

Figure 6E:
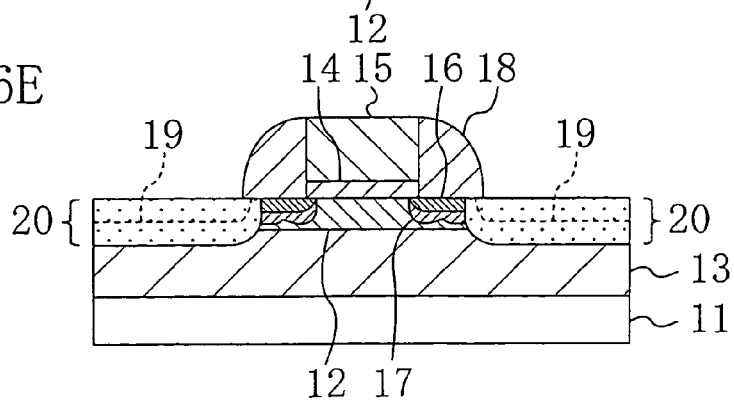

In the step shown in FIG. 6E, the semiconductor substrate 11 formed with the amorphous layers 21, the p-type ion implanted layers 19A, and the n-type implanted source and drain layers 20A is heated to about 400 to 700° C., more preferably to about 400 to 600° C. After the heating, a third thermal treatment at an extremely low temperature (referred hereinafter to as an extremely low-temperature thermal treatment) is performed on the semiconductor substrate 11 in the state in which the temperature the heated substrate 11 has reached is kept for from several seconds to about 10 hours at the maximum. The treatment temperature of this treatment is sufficiently low, so that impurity diffusion resulting from transient enhanced diffusion hardly occurs and only restoration of crystal damages caused by ion implantation and of the amorphized crystal proceeds. As a result, the positions of junctions are almost the same as the positions thereof located immediately after the respective ion implantations.

Subsequently to the third extremely low-temperature thermal treatment, the semiconductor substrate 11 is heated to about 850 to 1000° C. at a heating rate of about 200 to 250° C./sec. After the heating, a fourth rapid thermal annealing is performed either with the peak temperature thereof kept for about 10 seconds at the maximum or with the peak temperature not kept. The fourth rapid thermal annealing activates arsenic ions contained in the n-type implanted source and drain layers 20A to form, in regions of the semiconductor substrate 11 located below the sides of the sidewalls 18, n-type diffused source and drain layers 20. By the formation of the n-type diffused source and drain layers 20, the n-type diffused extension layers 16 and the p-type diffused pocket layers 17 are also formed between the p-type diffused channel layer 12 below the gate electrode 15 and the n-type diffused source and drain layers 20. Each of the n-type diffused source and drain layers 20 has a junction connected to the n-type diffused extension layer 16 and made deeper than the n-type diffused extension layer 16. In this state, inside each of the n-type diffused source and drain layers 20, the p-type impurity implanted region 19 shown by the broken curve is embedded which is formed from the p-type ion implanted layer 19A. The p-type impurity concentration of the p-type impurity implanted region 19 is lower than the n-type impurity concentration of the n-type diffused source and drain layers 20, so that the p-type impurity implanted region 19 will not be formed in the structure of a p-type impurity diffused layer. The fourth rapid thermal annealing, such as spike RTA, laser annealing, and flash lamp annealing, can be performed to enhance activation of impurities for which the activation only by the third extremely low-temperature thermal treatment is inadequate.

As described above, according to the second embodiment, in the step shown in FIG. 6C, the amorphous layers 21 are formed in the source and drain formation region, and then in the step shown in FIG. 6D, the p-type ion implanted layers 19A and the n-type implanted source and drain layers 20A are formed. The formed amorphous layer 21 suppresses channeling of arsenic in forming the n-type implanted source and drain layers 20A, whereby the n-type implanted source and drain layers 20A having a shallow impurity profile can be formed.

Thereafter, in the step shown in FIG. 6E, subsequently to crystal restoration by the third extremely low-temperature thermal treatment, the fourth rapid thermal annealing carries out activation. Thereby, the implanted impurity can be activated with this impurity hardly diffused. As described above, during this activation, ionized donor and acceptor atoms have the property of being electrically attracted to each other by the thermal treatment to produce an ion pair. By this property, ionized arsenic in the n-type implanted source and drain layers 20A and ionized indium in the p-type ion implanted layer 19A produce an ion pair, which suppresses transient enhanced diffusion of arsenic. Therefore, the n-type diffused source and drain layers 20 can be formed which has a shallower junction than the case where only an n-type impurity is implanted.

Thus, the ion pair suppresses arsenic diffusion, which eliminates the necessity to set the thermal treatment performed subsequently to the extremely low-temperature thermal treatment and performed for activation for forming the diffused source and drain layers at a temperature higher than required. Moreover, in the thermal treatment, the time for which the heated state is kept can be reduced, so that the activation process can be carried out with a low thermal budget. Furthermore, the step of activating the impurity for source and drain formation can be carried out with a low thermal budget, which also avoids the conventional drawback that by the thermal treatment in this step, redistribution of the impurity occurs in the diffused extension layer having once been formed shallowly, thereby making the junction thereof deep.

Moreover, since, in the step shown in FIG. 6E, the extremely low-temperature thermal treatment is performed after the ion implantation into the source and drain formation region, the amorphous layer formed by high-dose implantation for pre-amorphization can be restored to a crystal layer. In this treatment, the thermal treatment temperature is sufficiently low. Therefore, only point defects disappear by diffusion and recombination, impurity diffusion resulting from transient enhanced diffusion hardly occurs, and only regrowth of the amorphous layer proceeds. It is known that under thermal treatment temperatures of about 400 to 700° C., more limitedly, about 400 to 600° C., within which the above-mentioned actions arise, solid phase regrowth occurs in the amorphous layer. Thus, the junction of arsenic and indium implanted into the source and drain formation region can keep a shallow junction that is almost the same as that made at the time of the ion implantation. During restoration of the crystal of the amorphous layer, the layer is in the metastable state in which the solubility limit of the contained impurity is higher than that of the impurity contained in the crystal layer.

Furthermore, since, in the step shown in FIG. 6C, germanium ions belonging to the group IV are implanted, the source and drain formation region can be amorphized selectively and positively. Thus, the source and drain formation region is pre-amorphized before formation of the n-type implanted source and drain layers 20A, so that not only channeling in the depth direction of the implantation profile of arsenic ions implanted into the n-type implanted source and drain layers 20A, but also laterally struggling intrusion of arsenic ions into the region below the gate electrode 15 resulting from channeling in the <110>-oriented zone axis can be suppressed.

Moreover, as described above, it is known that indium strongly segregates to a dislocation loop defect layer. Therefore, by forming the p-type ion implanted layers 19A with indium ions implanted therein within the n-type implanted source and drain layers 20A with arsenic ions implanted, the indium is trapped into the dislocation loop defect layer. This suppresses transient enhanced diffusion of arsenic caused by releasing interstitial silicon from the dislocation loop defect layer.

As is apparent from the above, the n-type diffused source and drain layers 20 with shallow junctions can be formed certainly while redistribution of the impurity contained in the n-type diffused extension layer 16 is prevented.

Moreover, indium ions with a relatively large mass number are used for formation of the p-type diffused channel layer 12. Therefore, a region of the p-type diffused channel layer 12 located around the substrate surface has a decreased impurity concentration, while a region thereof located away from the substrate surface has an increased impurity concentration. That is to say, a retrograde impurity profile can be provided in this layer. This prevents a decrease in carrier mobility mainly resulting from impurity dispersion and therefore minimizes manifestation of short channel effect. As a result, the transistor in the device can be miniaturized reliably.

Third Embodiment

A semiconductor device according to a third embodiment of the present invention will be described below with reference to the accompanying drawings.

FIGS. 7A to 7D and FIGS. 8A to 8C show sectional structures of a fabrication method of a semiconductor device according to the third embodiment of the present invention in the order of its fabrication process steps. Also in the third embodiment, description will be made using an n-channel type MIS transistor.

Figure 7A:
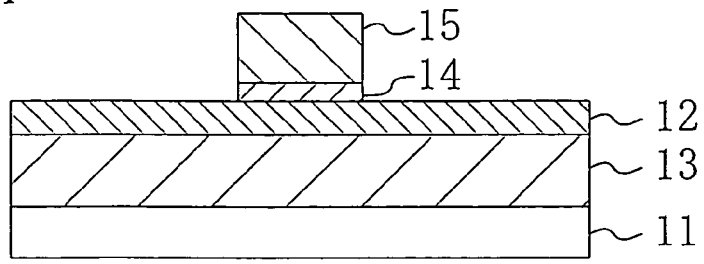
FIGS. 7A to 7D are sectional views showing process steps of a method for fabricating a semiconductor device according to a third embodiment of the present invention.

First, in a similar manner to the first embodiment, as shown in FIG. 7A, a p-type diffused channel layer 12 and a p-type diffused well layer 13 are formed in the upper portion of a semiconductor substrate 11 of p-type silicon. Thereafter, a gate insulating film 14 of silicon oxide having a thickness of about 1.5 nm is selectively formed on a main surface of the semiconductor substrate 11, and on the gate insulating film 14, a gate electrode 15 is selectively formed which is made of polysilicon or polymetal having a thickness of about 150 nm.

Figure 7B:
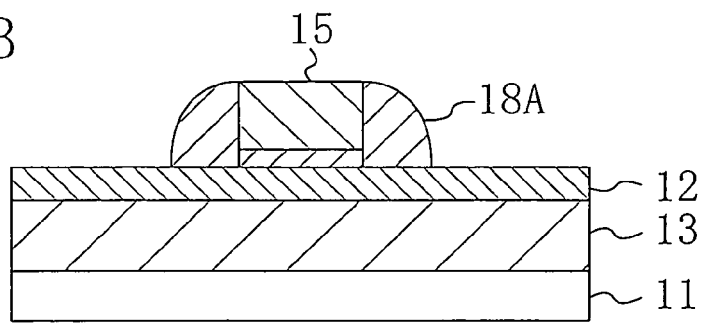

Next, in the step shown in FIG. 7B, by a CVD method or the like, a silicon nitride film having a thickness of about 50 nm is deposited over the entire surface of the semiconductor substrate 11 including the gate electrode 15. The deposited silicon nitride film is anisotropically etched to form first sidewalls 18A of silicon nitride on side surfaces of the gate electrode 15. The first sidewalls 18A may be made not of silicon nitride but of a single-layer film of silicon oxide, a laminate film composed of a silicon oxide film having an L-shaped cross section and a silicon nitride film having a plate-like cross section on the silicon oxide film, or the like. An offset spacer may be formed between each of the first sidewalls 18A and the gate electrode 15.

Figure 7C:
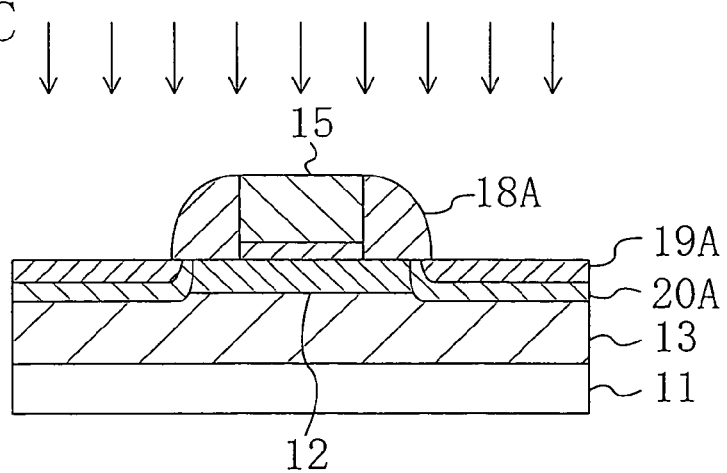

Subsequently, in the step shown in FIG. 7C, using the gate electrode 15 and the first sidewalls 18A as a mask, indium ions serving as a p-type impurity are implanted into the semiconductor substrate 11 on an implantation condition of an implantation energy of 10 keV and a dose of $1\times10^{14}$ ions/cm$^2$, thereby forming p-type ion implanted layers 19A. Thereafter, using the gate electrode 15 and the first sidewalls 18A as a mask, arsenic ions serving as an n-type impurity are implanted into the semiconductor substrate 11 on an implantation condition of an implantation energy of 15 keV and a dose of $3\times10$ ions/cm$^2$, thereby forming n-type implanted source and drain layers 20A. Into the n-type implanted source and drain layers 20A, the impurity is implanted which has a deeper implantation depth and a higher concentration than the p-type ion implanted layer 19A. Although not shown, in order to release an electric field in the source and drain region, phosphorus (P) ions serving as an n-type impurity may be additionally implanted after the implantation of arsenic ions on an implantation condition of an implantation energy of 20 keV and a dose of $1\times10^{13}$ ions/cm$^2$. Since the surface of the semiconductor substrate 11 and its vicinity are amorphized by the implantations of indium and a high dose of arsenic, the subsequent implantation of phosphorus ions for releasing the electric field has an implantation profile with a channeling greatly suppressed by the pre-amorphous effect. For the n-type implanted source and drain layers 20A, use may be made of phosphorus ions instead of arsenic ions.

Figure 7D:
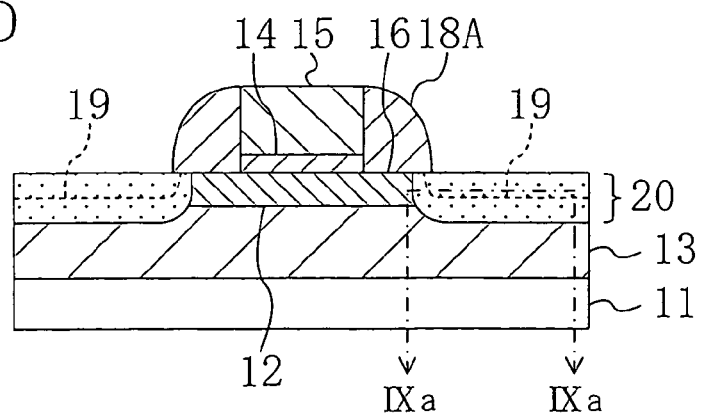

In the step shown in FIG. 7D, the semiconductor substrate 11 is heated to about 850 to 1000° C. at a heating rate of about 200 to 250° C./sec. After the heating, a first rapid thermal annealing is performed either with the peak temperature thereof kept for about 10 seconds at the maximum or with the peak temperature not kept. The first rapid thermal annealing activates arsenic ions contained in the n-type implanted source and drain layers 20A to form, in regions of the semiconductor substrate 11 located below the sides of the first sidewalls 18A, the n-type diffused source and drain layers 20. In this state, inside each of the n-type diffused source and drain layers 20, the p-type impurity implanted region 19 shown by the broken curve is embedded which is formed from the p-type ion implanted layer 19A. The p-type impurity concentration of the p-type impurity implanted region 19 is lower than the n-type impurity concentration of the n-type diffused source and drain layers 20, so that the p-type impurity implanted region 19 will not be formed in the structure of a p-type impurity diffused layer.

Figure 8A:
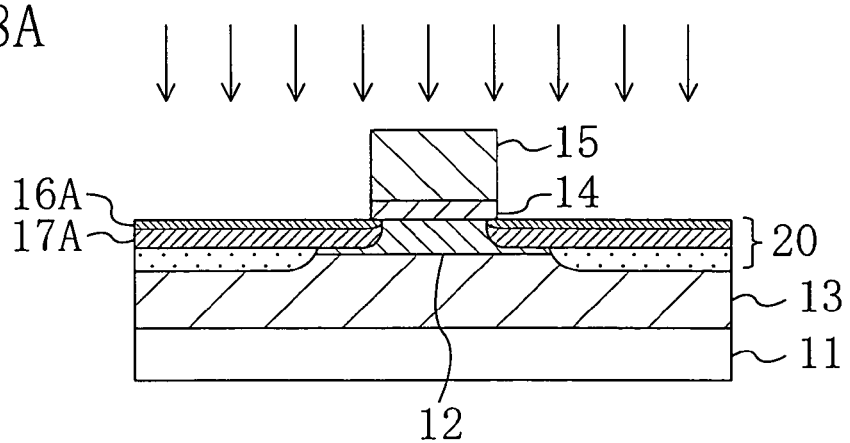
FIGS. 8A to 8C are sectional views showing process steps of the method for fabricating a semiconductor device according to the third embodiment of the present invention.

Next, in the step shown in FIG. 8A, the first sidewalls 18A are selectively removed by, for example, wet etching with a hot solution of phosphoric acid. Then, using the gate electrode 15 as a mask, arsenic (As) ions serving as an n-type impurity are implanted into the semiconductor substrate 11 on an implantation condition of an implantation energy of 2 keV and a dose of $2\times10^{14}$ ions/cm$^2$, thereby forming n-type implanted extension layers 16A. Further, using the gate electrode 15 as a mask, boron ions serving as a p-type impurity are implanted into the semiconductor substrate 11 on an implantation condition of an implantation energy of 10 keV and a dose of $1\times10^{13}$ ions/cm$^2$, thereby forming p-type implanted pocket layers 17A.

Figure 8B:
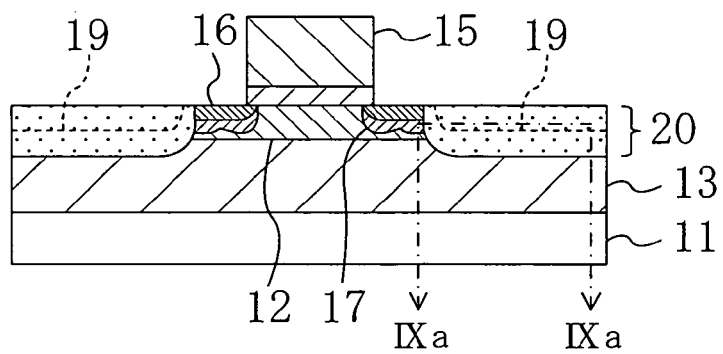
Figure 8C:
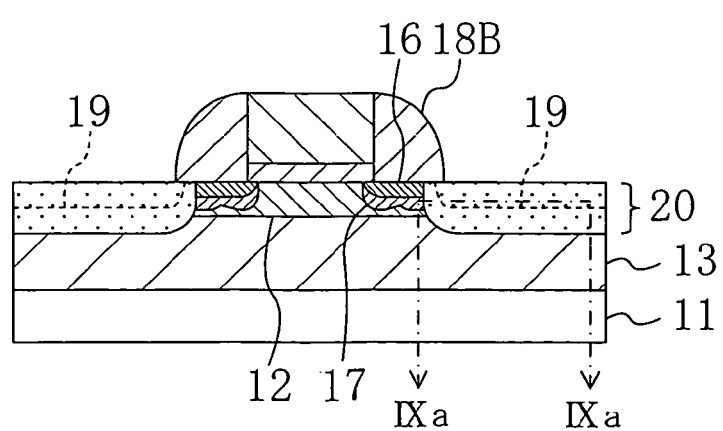

In the step shown in FIG. 8B, the semiconductor substrate 11 is heated to about 850 to 1050° C. at a heating rate of about 200° C./sec. After the heating, a second rapid thermal annealing is performed either with the peak temperature thereof kept for about 10 seconds at the maximum or with the peak temperature not kept. The second rapid thermal annealing activates arsenic ions contained in the n-type implanted extension layers 16A to form, in regions of the semiconductor substrate 11 located below both sides of the gate electrode 15, n-type diffused extension layers 16 having relatively shallow junctions. This annealing also activates boron ions contained in the p-type implanted pocket layers 17A to form, below the n-type diffused extension layers 16, p-type diffused pocket layers 17 having a higher impurity concentration than the p-type diffused channel layer 13. The n-type diffused extension layers 16 have junctions which are connected to the n-type diffused source and drain layers 20 and which are shallower than the n-type diffused source and drain layers 20, respectively.

Subsequently, in the step shown in FIG. 5C, in a similar manner to the step shown in FIG. 7B, second sidewalls 18B are formed again on the both side surfaces of the gate electrode 15. Thus, in the third embodiment, the first sidewalls 18A are removed after formation of the n-type diffused source and drain layers 20, and the second sidewalls 18B are formed again after formation of the n-type diffused extension layer 16 and the p-type diffused pocket layer 17. This eliminates the disadvantage that the thickness (width) of the second sidewall 18B restricts the dimensions in the gate length direction of the n-type diffused source and drain layers 20, the n-type diffused extension layer 16, and the p-type diffused pocket layer 17. Therefore, the thickness (width) of the second sidewall 18B can be set freely. Also in this embodiment, the second sidewalls 18B may be made not of silicon nitride but of a single-layer film of silicon oxide, a laminate film composed of a silicon oxide film having an L-shaped cross section and a silicon nitride film having a plate-like cross section on the silicon oxide film, or the like. An offset spacer may be formed between each of the second sidewalls 18B and the gate electrode 15.

Figure 9A:
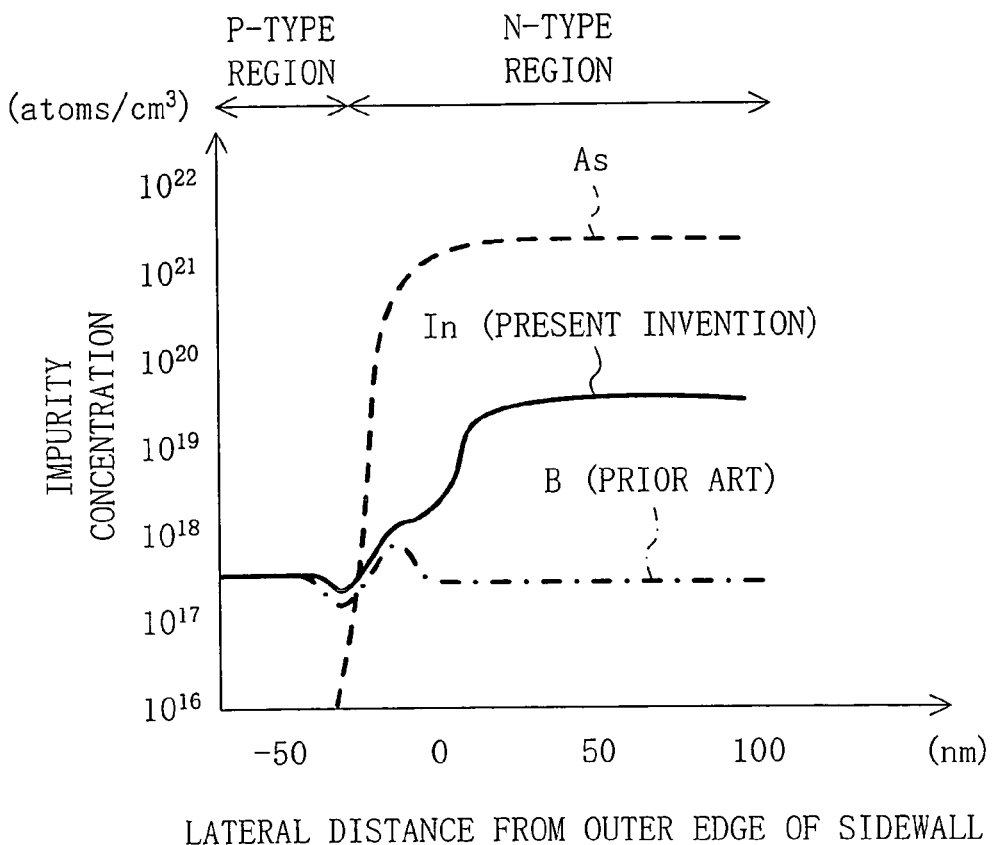
FIG. 9A is a graph showing the lateral impurity concentration profile of a portion of an n-type diffused source/drain layer which is taken along the line IXa—IXa in FIGS. 7D, 8B, 8C, 11A, 11C, and 11D.

FIG. 9A shows the lateral impurity concentration profile of a portion of the n-type diffused source/drain layer 20 which is taken along the line IXa—IXa in FIGS. 7D, 8B and 5C. FIG. 9A plots the logarithm of the impurity concentration in ordinate and the distance from the outer edge of the sidewall in abscissa. In FIG. 9A, the solid curve represents the concentration of indium contained in the p-type impurity region 19 and implanted into the source and drain formation region according to the present invention, while the broken curve represents the concentration of arsenic in the n-type diffused source and drain layers 20. For comparison purposes, the concentration of boron introduced into the source and drain formation region during the conventional formation of the diffused pocket layer is represented by the alternate long and short dashed curve. As shown in FIG. 9A, indium that is a p-type impurity for the p-type impurity region 19 introduced within the n-type diffused source and drain layers 20 has a higher concentration than boron introduced by the conventional formation of the p-type diffused pocket layer. The introduced indium interacts with arsenic to suppress arsenic diffusion.

As described above, according to the third embodiment, in the step shown in FIG. 7D, the n-type implanted source and drain layers 20A for forming the n-type diffused source and drain layers 20 and the p-type ion implanted layers 19A having a lower impurity concentration than the n-type implanted source and drain layers 20A are formed prior to formation of the n-type diffused extension layers 16. Thereafter, in the step shown in FIG. 8B, the second rapid thermal annealing is performed to activate arsenic ions in the n-type implanted source and drain layers 20A and indium ions in the p-type ion implanted layer 19A. Since, in this treatment, the impurity concentration of the n-type implanted source and drain layers 20A is higher than that of the p-type ion implanted layer 19A, the n-type diffused source and drain layers 20 can be formed certainly.

As mentioned above, ionized arsenic in the n-type implanted source and drain layers 20A and ionized indium in the p-type ion implanted layer 19A produce an ion pair. The produced ion pair suppresses transient enhanced diffusion of arsenic, whereby the n-type diffused source and drain layers 20 can be formed which has a shallower junction depth than the case where only an n-type impurity is implanted.

Figure 9B:
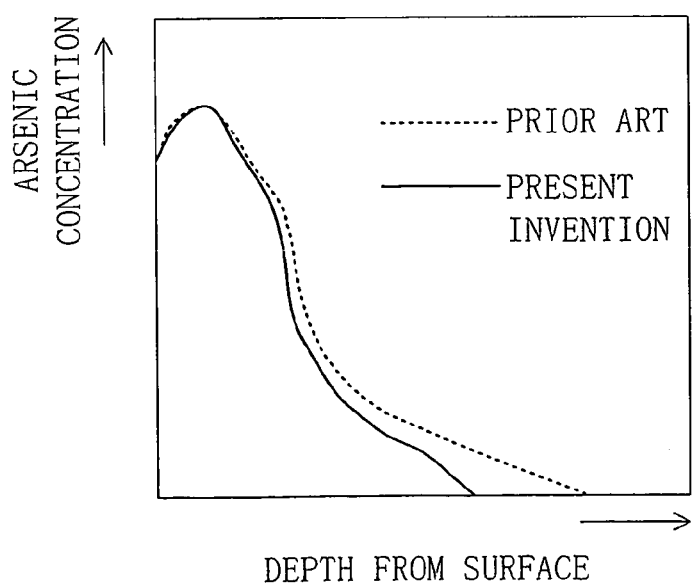
FIG. 9B is a graph showing results of simulations of impurity profiles of arsenic obtained after thermal treatment and from processes with and without indium implantation for producing ion pairs.

FIG. 9B shows results of simulations of the impurity profiles of arsenic obtained after the thermal treatment and from the processes with and without the indium implantation for producing ion pairs. From FIG. 9B, it is found that since indium for forming ion pairs is implanted in the present invention, the junction of arsenic in the present invention is shallower than that of the conventional case where indium for forming ion pairs is not implanted.

Thus, the ion pair of arsenic and indium suppresses arsenic diffusion, which eliminates the necessity to set the thermal treatment for activation for forming the n-type diffused source and drain layers 20 at a temperature higher than required. Moreover, in the thermal treatment step, the necessity to set the time for which the heated state is kept is eliminated, so that the activation process can be carried out with a low thermal budget.

Furthermore, the n-type diffused extension layer 16 is formed after formation of the n-type diffused source and drain layers 20, which also avoids the situation in which by the thermal treatment in the step of activating the n-type impurity for source and drain formation, redistribution occurs in the impurity contained in the n-type diffused extension layer 16 having been formed once, thereby making the junction depth thereof deep.

Moreover, if the gate electrode 15 is made of polysilicon or polymetal, an activation process for an impurity introduced in the polysilicon forming the gate electrode 15 can also be carried out by the formation step of the diffused source and drain layers 20 to more fully activate the polysilicon or the like forming the gate electrode 15.

As is apparent from the above, with the method for fabricating a semiconductor device according to the third embodiment, the n-type diffused source and drain layers 20 with shallow junctions can be formed certainly while redistribution of the impurity in the n-type diffused extension layer 16 is suppressed.

Moreover, indium ions with a relatively large mass number are used for formation of the p-type diffused channel layer 12. Therefore, a region of the p-type diffused channel layer 12 located around the substrate surface has a decreased impurity concentration, while a region thereof located slightly deeper than the substrate surface has an increased impurity concentration. That is to say, a retrograde impurity profile can be provided in this layer. This prevents a decrease in carrier mobility mainly resulting from impurity dispersion and therefore minimizes manifestation of short channel effect. As a result, the transistor in the device can be miniaturized reliably.

Fourth Embodiment

A semiconductor device according to a fourth embodiment of the present invention will be described below with reference to the accompanying drawings.

FIGS. 10A to 10D and FIGS. 11A to 11D show sectional structures of a fabrication method of a semiconductor device according to the fourth embodiment of the present invention in the order of its fabrication process steps. Also in the fourth embodiment, description will be made using an n-channel type MIS transistor.

Figure 10A:
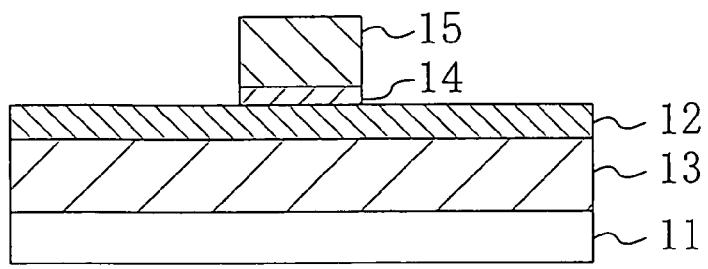
FIGS. 10A to 10D are sectional views showing process steps of a method for fabricating a semiconductor device according to a fourth embodiment of the present invention.

First, in a similar manner to the first embodiment, as shown in FIG. 10A, a p-type diffused channel layer 12 and a p-type diffused well layer 13 are formed in the upper portion of a semiconductor substrate 11 of p-type silicon. Thereafter, a gate insulating film 14 of silicon oxide having a thickness of about 1.5 nm is selectively formed on a main surface of the semiconductor substrate 11, and on the gate insulating film 14, a gate electrode 15 is selectively formed which is made of polysilicon or polymetal having a thickness of about 150 mm.

Figure 10B:
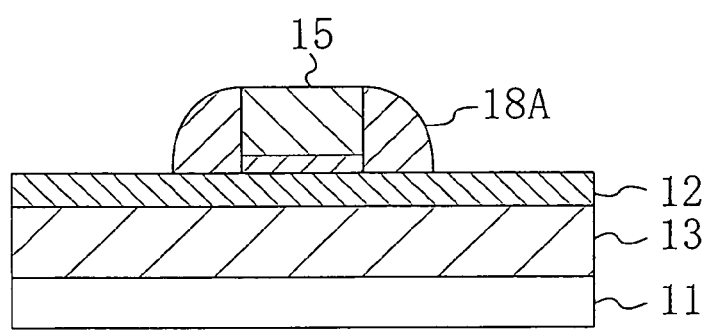

Next, in the step shown in FIG. 10B, by a CVD method or the like, a silicon nitride film having a thickness of about 50 nm is deposited over the entire surface of the semiconductor substrate 11 including the gate electrode 15. The deposited silicon nitride film is anisotropically etched to form first sidewalls 18A of silicon nitride on side surfaces of the gate electrode 15. The first sidewalls 18A may be made not of silicon nitride but of a single-layer film of silicon oxide, a laminate film composed of a silicon oxide film having an L-shaped cross section and a silicon nitride film having a plate-like cross section on the silicon oxide film, or the like. An offset spacer may be formed between each of the first sidewalls 18A and the gate electrode 15.

Figure 10C:
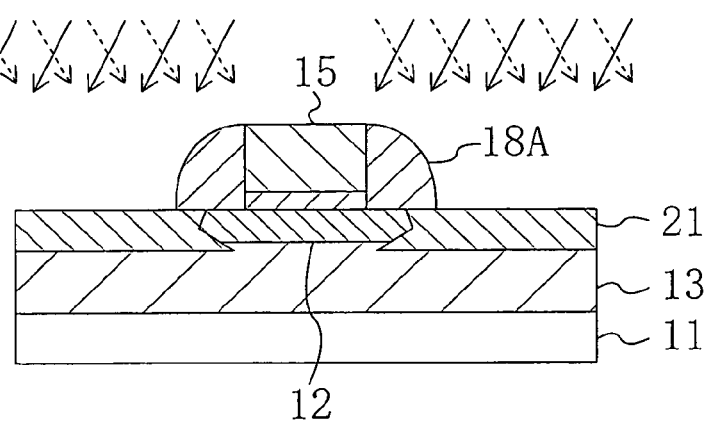

Thereafter, in the step shown in FIG. 10C, using the gate electrode 15 and the first sidewalls 18A as a mask, germanium (Ge) ions belonging to the group IV are implanted into the semiconductor substrate 11 at an implantation energy of 100 keV, a dose of $1 \times 10^{15}$ ions/cm$^2$, and a tile angle (implantation angle) of about 20 degrees with respect to the normal to the substrate surface, thereby forming amorphous layers 21 in source and drain formation regions of the semiconductor substrate 11. The amorphous layers 21 are desirably formed to have a shallower depth than an implanted source and drain layers that will be formed in a later step. In addition, this angled implantation amorphizes also regions of the semiconductor substrate 11 located below the first sidewalls 18A, so that entry of arsenic ions into the region below the gate electrode 15 resulting from channeling in the <110>-oriented zone axis can be suppressed more certainly. Thus, even though the amorphous layer 21 is formed by angled implantation, the first sidewalls 18A covering side surfaces of the gate electrode 15 and the gate insulating film 14 eliminates the possibility that side edges of the gate insulating film 14 are damaged by the germanium ions. As a group IV element forming the amorphous layer 21, silicon (Si) may be used instead of germanium.

Subsequently, in the step shown in FIG. 10D, using the gate electrode 15 and the first sidewalls 18A as a mask, indium ions serving as a p-type impurity are implanted into the amorphous layers 21 formed in the semiconductor substrate 11 on an implantation condition of an implantation energy of 10 keV and a dose of $1\times10^{14}$ ions/cm$^2$, thereby forming p-type ion implanted layers 19A. Subsequently, using the gate electrode 15 and the first sidewalls 18A as a mask, arsenic ions serving as an n-type impurity are implanted into the amorphous layers 21 formed in the semiconductor substrate 11 on an implantation condition of an implantation energy of 15 keV and a dose of $3\times10^{15}$ ions/cm$^2$, thereby forming n-type implanted source and drain layers 20A. Into the n-type implanted source and drain layers 20A, the impurity is implanted which has a deeper implantation depth and a higher concentration than the p-type ion implanted layer 19A. Although not shown, in order to release an electric field in the source and drain region, phosphorus (P) ions serving as an n-type impurity may be additionally implanted after the implantation of arsenic ions on an implantation condition of an implantation energy of 20 keV and a dose of $1\times10^{13}$ ions/cm$^2$. Since the surface of the semiconductor substrate 11 and its vicinity are amorphized by the implantations of indium and a high dose of arsenic, the subsequent implantation of phosphorus ions for releasing the electric field has an implantation profile with a channeling greatly suppressed by the pre-amorphous effect. For the n-type implanted source and drain layers 20A, use may be made of phosphorus ions instead of arsenic ions.

Figure 11A:
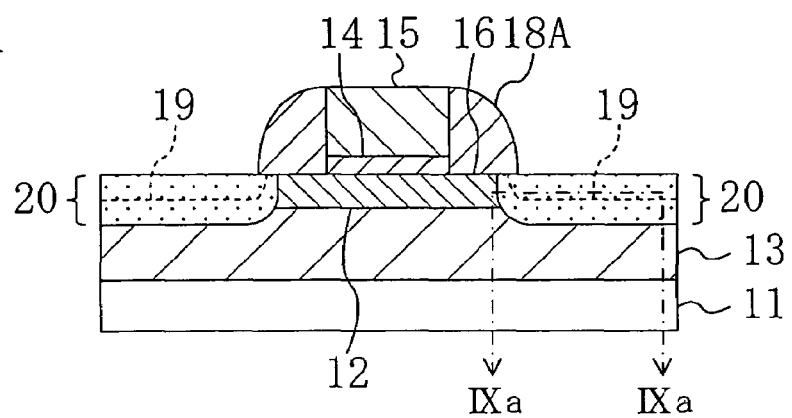
FIGS. 11A to 11D are sectional views showing process steps of the method for fabricating a semiconductor device according to the fourth embodiment of the present invention.

In the step shown in FIG. 11A, the semiconductor substrate 11 formed with the amorphous layers 21, the p-type ion implanted layers 19A, and the n-type implanted source and drain layers 20A is heated to about 400 to 700° C., more preferably to about 400 to 600° C. After the heating, a first extremely low-temperature thermal treatment is performed on the semiconductor substrate 11 for from several seconds to about 10 hours at the maximum. The treatment temperature of this treatment is sufficiently low, so that impurity diffusion resulting from transient enhanced diffusion hardly occurs. Therefore, only restoration of crystal damages caused by ion implantation and of the amorphized crystal proceeds, and the positions of junctions of the implanted layers are almost the same as the positions thereof located immediately after the respective ion implantations.

Subsequently to the first extremely low-temperature thermal treatment under an extremely low temperature, the semiconductor substrate 11 is heated to about 850 to 1000° C. at a heating rate of about 200 to 250° C./sec. After the heating, a second rapid thermal annealing (spike RTA, laser annealing, flash lamp annealing, or the like) is performed either with the peak temperature thereof kept for about 10 seconds at the maximum or with the peak temperature not kept. The second rapid thermal annealing activates arsenic ions contained in the n-type implanted source and drain layers 20A to form, in regions of the semiconductor substrate 11 located below the sides of the first sidewalls 18A, n-type diffused source and drain layers 20. In this state, inside each of the n-type diffused source and drain layers 20, the p-type impurity implanted region 19 shown by the broken curve is embedded which is formed from the p-type ion implanted layer 19A. The p-type impurity concentration of the p-type impurity implanted region 19 is lower than the n-type impurity concentration of the n-type diffused source and drain layers 20, so that the p-type impurity implanted region 19 will not be formed in the structure of a p-type impurity diffused layer. The second rapid thermal annealing can be performed to enhance activation of impurities for which the activation only by the first extremely low-temperature thermal treatment is inadequate.

Figure 11B:
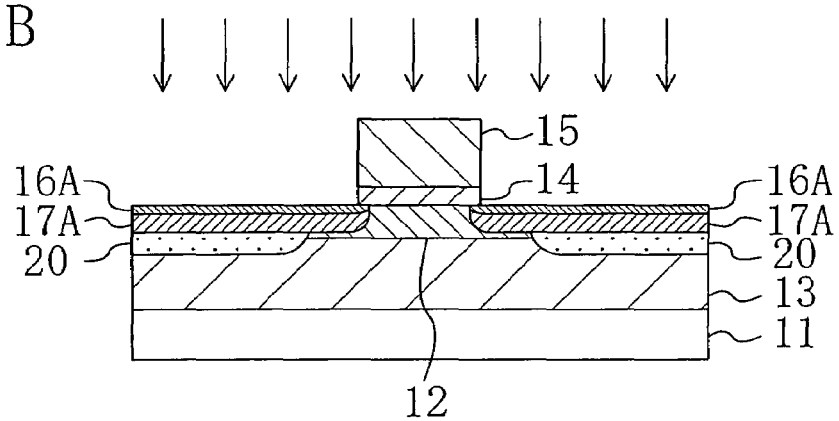

Next, in the step shown in FIG. 11B, the first sidewalls 18A are selectively removed by, for example, wet etching with a hot solution of phosphoric acid. Then, using the gate electrode 15 as a mask, arsenic (As) ions serving as an n-type impurity are implanted into the semiconductor substrate 11 on an implantation condition of an implantation energy of 2 keV and a dose of $2\times10^{14}$ ions/cm$^2$, thereby forming n-type implanted extension layers 16A. Further, using the gate electrode 15 as a mask, boron ions serving as a p-type impurity are implanted into the semiconductor substrate 11 on an implantation condition of an implantation energy of 10 keV and a dose of $1\times10^{13}$ ions/cm$^2$, thereby forming p-type implanted pocket layers 17A.

Figure 11C:
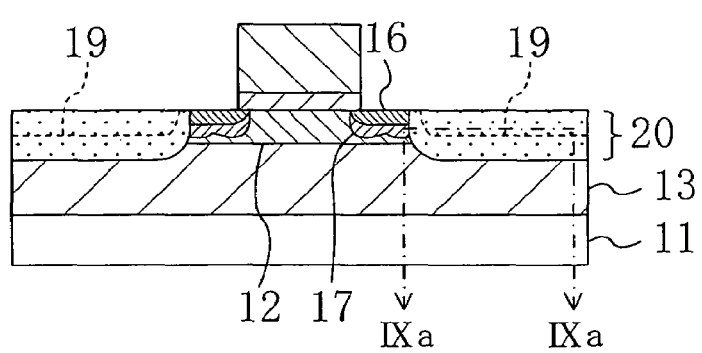

In the step shown in FIG. 11C, the semiconductor substrate 11 is heated to about 850 to 1050° C. at a heating rate of about 200° C./sec. After the heating, a third rapid thermal annealing is performed either with the peak temperature thereof kept for about 10 seconds at the maximum or with the peak temperature not kept. The third rapid thermal annealing activates arsenic ions contained in the n-type implanted extension layers 16A to form, in regions of the semiconductor substrate 11 located below both sides of the gate electrode 15, n-type diffused extension layers 16 having relatively shallow junctions. This annealing also activates boron ions contained in the p-type implanted pocket layers 17A to form, below the n-type diffused extension layers 16, p-type diffused pocket layers 17 having a higher impurity concentration than the p-type diffused channel layer 13. The n-type diffused extension layers 16 have junctions which are connected to the n-type diffused source and drain layers 20 and which are shallower than the n-type diffused source and drain layers 20, respectively.

Subsequently, in the step shown in FIG. 11D, in a similar manner to the step shown in FIG. 10B, second sidewalls 18B are formed again on the both side surfaces of the gate electrode 15. Thus, in the fourth embodiment, the first sidewalls 18A are removed after formation of the n-type diffused source and drain layers 20, and the second sidewalls 18B are formed again after formation of the n-type diffused extension layer 16 and the p-type diffused pocket layer 17. This eliminates the disadvantage that the thickness (width) of the second sidewall 18B restricts the dimensions in the gate length direction of the n-type diffused source and drain layers 20, the n-type diffused extension layer 16, and the p-type diffused pocket layer 17. Therefore, the thickness (width) of the second sidewall 18B can be set freely. Also in this embodiment, the second sidewalls 18B may be made not of silicon nitride but of a single-layer film of silicon oxide, a laminate film composed of a silicon oxide film having an L-shaped cross section and a silicon nitride film having a plate-like cross section on the silicon oxide film, or the like. An offset spacer may be formed between each of the second sidewalls 18B and the gate electrode 15.

Figure 11D:
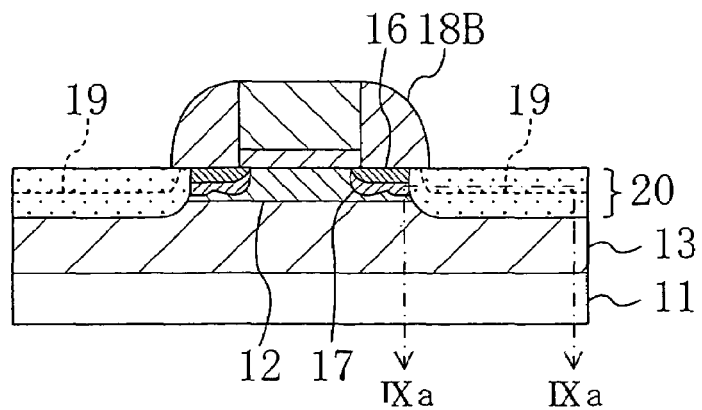
Figure 12A:
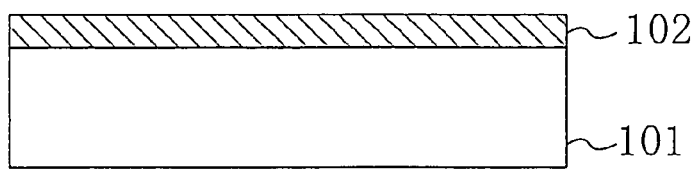
FIGS. 12A to 12E are sectional views showing process steps of a conventional method for fabricating a semiconductor device.
Figure 12B:
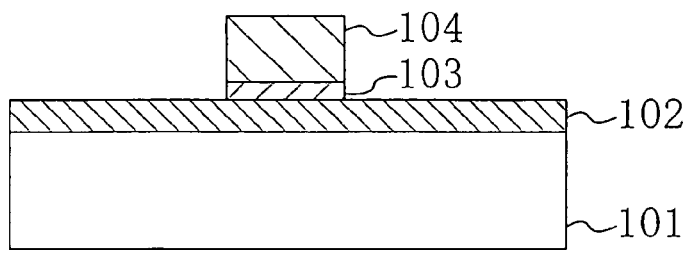
Figure 12C:
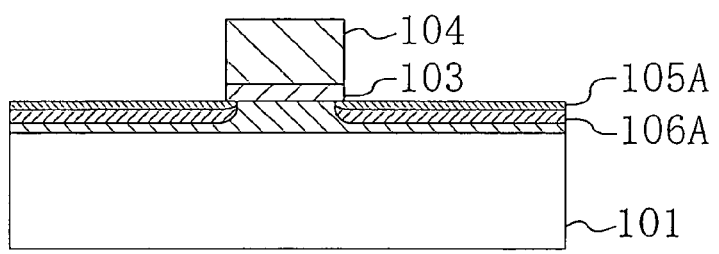
Figure 12D:
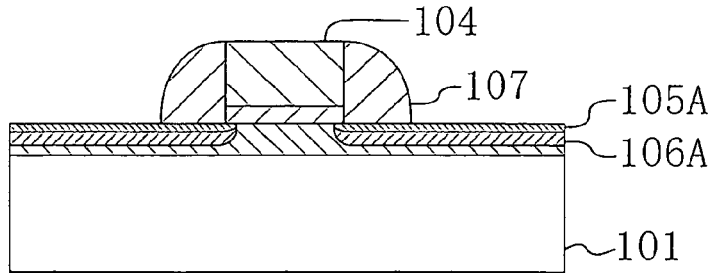
Figure 12E:
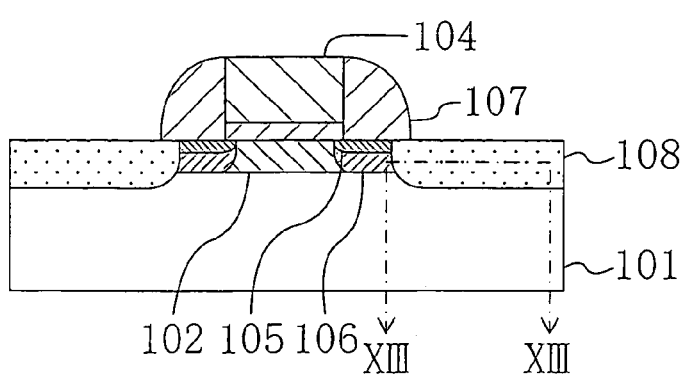
Figure 13:
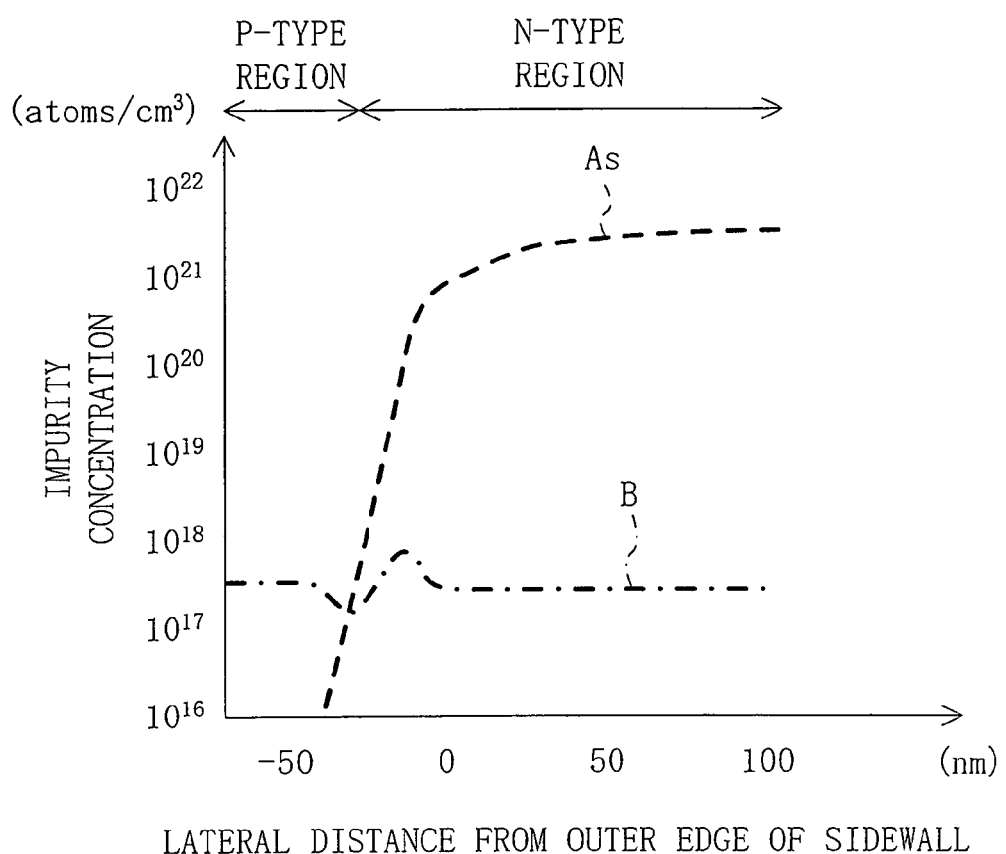
FIG. 13 is a graph showing the lateral impurity concentration profile of a portion of an n-type diffused source/drain layer which is taken along the line XIII—XIII in FIG. 12E.

FIG. 9A shows the lateral impurity concentration profile of a portion of the n-type diffused source/drain layer 20 which is taken along the line IXa—IXa in FIGS. 11A, 11C and 11D.

Figure 10D:
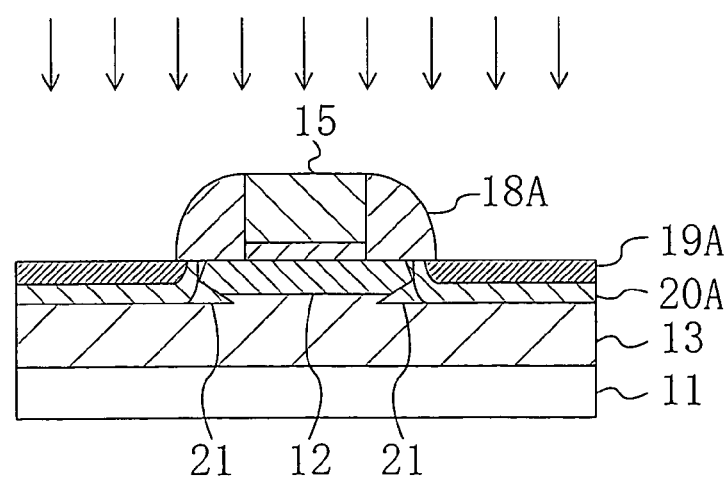

As described above, according to the fourth embodiment, in the step shown in FIG. 10C, the amorphous layer 21 is formed in the n-type source and drain formation region by implantation of germanium ions, and then in the step shown in FIG. 10D, the p-type ion implanted layers 19A and the n-type implanted source and drain layers 20A are formed. Thus, by forming the amorphous layer 21 in the n-type source and drain formation region, channeling of arsenic in forming the n-type implanted source and drain layers 20A is suppressed. Consequently, the n-type implanted source and drain layers 20A having shallow impurity profiles can be formed.

Thereafter, in the step shown in FIG. 11A, subsequently to crystal restoration by the first extremely low-temperature thermal treatment, the second rapid thermal annealing carries out activation. Thereby, the implanted impurity can be activated with this impurity hardly diffused. As described above, during this activation, ionized donor and acceptor atoms are electrically attracted to each other by the thermal treatment to produce an ion pair. By this, ionized arsenic in the n-type implanted source and drain layers 20A and ionized indium in the p-type ion implanted layers 19A produce an ion pair, which suppresses transient enhanced diffusion of arsenic. Therefore, the n-type diffused source and drain layers 20 can be formed which have a shallower junction depth than the case where only an n-type impurity is implanted.

Thus, the ion pair suppresses arsenic diffusion, which eliminates the necessity to set the second rapid thermal annealing performed subsequently to the first extremely low-temperature thermal treatment and performed for activation for forming the n-type diffused source and drain layers 20 at a temperature higher than required. Also, the necessity to keep the heated state for a long time even after completion of the heating is eliminated, so that the activation process can be carried out with a low thermal budget. The n-type diffused extension layer 16 is formed after formation of the n-type diffused source and drain layers 20, which also avoids the situation in which by the thermal treatment in the step of activating the n-type impurity for source and drain formation, redistribution of the impurity occurs in the n-type diffused extension layer 16 having once been formed shallowly, thereby making the junction depth thereof deep.

Moreover, as shown in FIG. 11A, by performing the first extremely low-temperature thermal treatment immediately after the implantation of arsenic ions into the source and drain formation region, the crystal of the amorphous layer 21 formed by high-dose implantation for pre-amorphization can be restored. In the first extremely low-temperature thermal treatment, the thermal treatment temperature is sufficiently low. Therefore, only point defects in the semiconductor substrate 11 disappear by diffusion and recombination, impurity diffusion resulting from transient enhanced diffusion hardly occurs, and only regrowth of the amorphous layer 21 proceeds. As mentioned above, under thermal treatment temperatures of about 400 to 700° C., more limitedly, about 400 to 600° C., solid phase regrowth occurs in the amorphous layer 21. Thus, the junction of arsenic and indium implanted into the source and drain formation region can keep a shallow junction depth that is almost the same as that made at the time of the respective ion implantations. During restoration of the crystal of the amorphous layer, the layer is in the meta-stable state in which the solubility limit of the contained impurity is higher than that of the impurity contained in the crystal layer. Therefore, activation of the implanted ions in the amorphous layer is enhanced as compared to the case where the crystal layer is subjected to the thermal treatment with the same temperature.

Furthermore, in the fourth embodiment, by implanting in advance ions of the element belonging to the group IV into the source and drain formation region to form the amorphous layer 21, the source and drain formation region can be amorphized selectively and positively. That is to say, the source and drain formation region is pre-amorphized by angled implantation before formation of the n-type implanted source and drain layers 20A, whereby not only channeling in the depth direction of the implanted arsenic ions can be suppressed, but also laterally struggling intrusion of arsenic ions into the region below the gate electrode 15 resulting from channeling in the <110>-oriented zone axis can be suppressed.

Moreover, it is known that indium strongly segregates to a dislocation loop defect layer. Therefore, by forming the p-type ion implanted layers 19A with indium ions implanted therein within the n-type implanted source and drain layers 20A with arsenic ions implanted, the indium is trapped into the dislocation loop defect layer. This suppresses transient enhanced diffusion of arsenic contributing to release of interstitial silicon from the dislocation loop defect layer.

As is apparent from the above, the n-type diffused source and drain layers 20 with shallow junctions can be formed certainly while redistribution of the impurity in the n-type diffused extension layer 16 is suppressed.

Moreover, indium ions with a relatively large mass number are used for formation of the p-type diffused channel layer 12. Therefore, a region of the p-type diffused channel layer 12 located around the substrate surface has a decreased impurity concentration, while a region thereof located slightly deeper than the substrate surface has an increased impurity concentration. That is to say, a retrograde impurity profile can be provided in this layer. This prevents a decrease in carrier mobility mainly resulting from impurity dispersion and therefore minimizes manifestation of short channel effect. As a result, the transistor in the device can be miniaturized reliably.

Also in the second embodiment, angled implantation of germanium ions or silicon ions may be performed when the source and drain formation region is formed with the amorphous layer 21.

In the first to fourth embodiments, an indium ion is used as an impurity ion of the p-type diffused channel layer 12. Instead of this, a boron ion or an ion of an element heavier than boron and serving as a p-type element may be used thereas, or these ions may be used together. Furthermore, an element belonging to the group 3B and having a larger mass number than indium may be used. In addition, silicon oxide is used for the gate insulating film 12, but an oxynitride film or an insulating film of high dielectric such as hafnium oxide or hafnium silicate may be used therefor.

In the first to fourth embodiments, description has been made using the n-channel type MIS transistor as the semiconductor device. Instead of this, the device used may be a p-channel MIS transistor. In the case of the p-channel MIS transistor, as a p-type impurity ion forming p-type diffused source and drain layers, use can be made of a boron ion, an indium ion, or the like, and as an n-type impurity combining with the p-type impurity ion to produce an ion pair, use can be made of a group 5B element such as an arsenic ion, an antimony (Sb) ion, or a bismuth (Bi) ion.

In the first to fourth embodiments, silicon oxide is used for the gate insulating film 14, and polysilicon or polymetal is used for the gate electrode 15. Alternatively, a so-called gate replacement may be carried out in which the gate electrode 15 and the gate insulating film 14 are removed by etching after formations of the n-type diffused source and drain layers 20 and the n-type diffused extension layer 16, and then the gate electrode structure is substituted by employing the gate insulating film 14 made of a high dielectric film of silicon oxynitride, hafnium oxide, or the like and the gate electrode 15 made of a metal film of tungsten, titanium, or the like.

Figure 14:
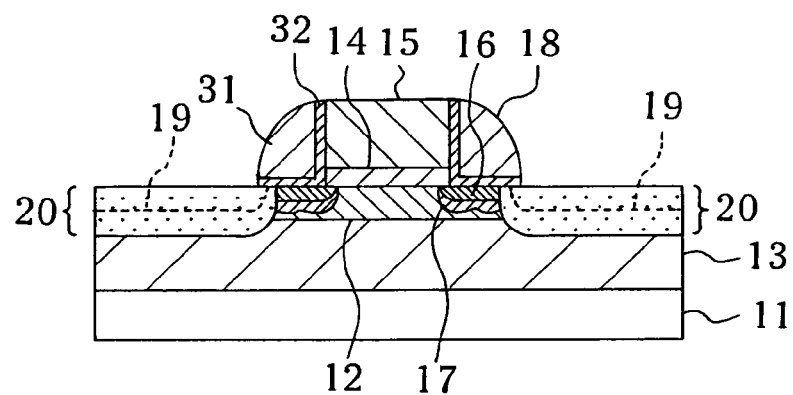
FIG. 14 is a sectional view showing an L-shaped silicon oxide film and a plate-like silicon nitride film.

FIG. 14 is a sectional view showing an L-shaped silicon oxide film 32 and a plate-like silicon nitride film 31.

Figure 15:
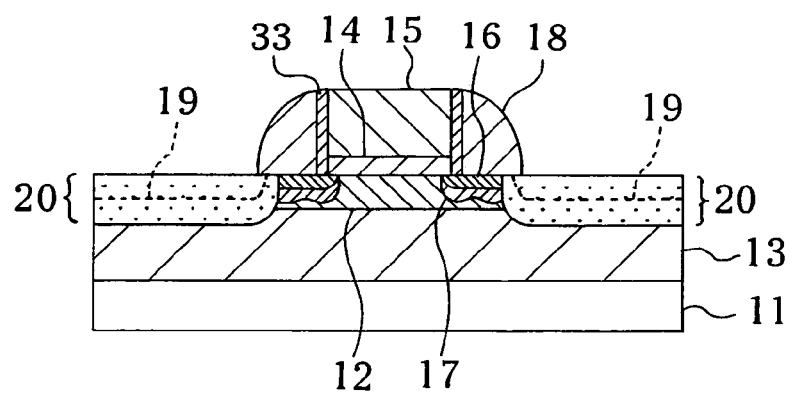
FIG. 15 is a sectional view showing an offset spacer.

FIG. 15 is a sectional view showing an offset spacer 33.

As described above, in the semiconductor device and the method for fabricating the device according to the present invention, implantation of an impurity with an opposite conductivity type to the impurity in the diffused source and drain layers into the diffused source and drain layers exerts the following effects: transient enhanced diffusion of the impurity forming the diffused source and drain layers can be suppressed by a low thermal budget, diffused source and drain layers with an abrupt, shallow junction can be formed, and impurity distribution in the diffused extension layer can be suppressed. Consequently, the semiconductor device according to the present invention is useful for a miniaturizable semiconductor device and the like having a diffused layer with a shallow junction and a low resistance.

What is claimed is:

1. A semiconductor device comprising:
  a semiconductor layer of a first conductivity type;
  a gate insulating film formed on the semiconductor layer;
  a gate electrode formed on the gate insulating film;
  insulating sidewalls formed on side surfaces of the gate electrode;
  diffused source and drain layers of a second conductivity type formed in regions of the semiconductor layer located outside the sidewalls, respectively,
  diffused extension layers of the second conductivity type formed in regions of the semiconductor layer located below the sides of the gate electrode and between the diffused source and drain layers, respectively; and
  diffused pocket layers of the first conductivity type formed in regions of the semiconductor layer located below the diffused extension layers, respectively,
  wherein insides of the diffused source and drain layers are formed with impurity implanted regions of the first conductivity type having a lower impurity concentration than the diffused source and drain layers, and
  the impurity concentration of the impurity implanted region is higher than that of the diffused pocket layer, and the impurity concentration is higher in the region outside the sidewall than in the region below the sidewall.

2. The device of claim 1, further comprising a diffused channel layer of the first conductivity type formed in a region of the semiconductor layer located below the gate electrode,
  wherein the impurity concentration of the impurity implanted region is higher than that of the diffused channel layer.

3. The device of claim 2, wherein the impurity of the first conductivity type forming the diffused channel layer is indium.

4. The device of claim 2, wherein the impurity of the first conductivity type forming the diffused channel layer is boron or an element heavier than boron.

5. The device of claim 1, wherein the impurity of the second conductivity type forming the diffused source and drain layers is arsenic, and the impurity of the first conductivity type forming the impurity implanted region is indium.

6. The device of claim 1, wherein the sidewalls are made of a laminate film composed of a silicon oxide film having an L-shaped cross section and a silicon nitride film having a plate-like cross section.

7. The device of claim 1, wherein an offset spacer is formed between the sidewalls and the gate electrode.

8. The device of claim 1, wherein the first conductivity type is p-type, and the second conductivity type is n-type.

9. The device of claim 1, wherein the gate insulating film is made of silicon oxide.

10. The device of claim 1, wherein the gate insulating film is an oxynitride film.

11. The device of claim 1, wherein the gate insulating film is an insulating film of high dielectric.

12. The device of claim 1, wherein the impurity of the second conductivity type forming the diffused source and drain layers is phosphorus, and the impurity of the first conductivity type forming the impurity implanted region is indium.

13. The device of claim 1, wherein the gate electrode is made of polysilicon.

14. The device of claim 1, wherein the gate electrode is made of polymetal.

15. The device of claim 1, wherein the gate electrode is made of metal.

16. The device of claim 1, wherein the impurity of the second conductivity type forming the diffused source and drain layers is born or indium, and the impurity of the first conductivity type forming the impurity implanted region is arsenic, antimony, or bismuth.

17. The device claim 1, wherein an impurity concentration profile of the impurity implanted region has a tendency to rise from a gate electrode side through under a peripheral end of the sidewall to outside the gate electrode.

* * * * *